United States Patent
Konta et al.

(10) Patent No.: US 10,393,844 B2
(45) Date of Patent: Aug. 27, 2019

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara-Shi, Tochigi-Ken (JP)

(72) Inventors: Hidetaka Konta, Utsunomiya (JP); Kiyomi Ooshima, Nasushiobara (JP); Masashi Ookawa, Otawara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1323 days.

(21) Appl. No.: 13/731,349

(22) Filed: Dec. 31, 2012

(65) Prior Publication Data

US 2013/0187651 A1 Jul. 25, 2013

(30) Foreign Application Priority Data

Jan. 25, 2012 (JP) ................. 2012-013022

(51) Int. Cl.
*G01R 33/565* (2006.01)
*G01R 33/58* (2006.01)
(Continued)

(52) U.S. Cl.
CPC ........ *G01R 33/565* (2013.01); *G01R 33/5611* (2013.01); *G01R 33/56383* (2013.01); *G01R 33/583* (2013.01); *G01R 33/543* (2013.01)

(58) Field of Classification Search
CPC .......... G01R 33/56383; G01R 33/3415; G01R 33/56375; G01R 33/543; G01R 33/5611; G01R 33/565; G01R 33/583
See application file for complete search history.

(56) References Cited

U.S. PATENT DOCUMENTS

2002/0021128 A1* 2/2002 Kuhara .............. G01R 33/5611
324/309
2005/0248344 A1 11/2005 Kuhara
2006/0049829 A1 3/2006 Takizawa et al.
(Continued)

FOREIGN PATENT DOCUMENTS

CN 1676097 A 10/2005
CN 1821804 A 8/2006
(Continued)

OTHER PUBLICATIONS

Full english translation of JP2005040464 provided by Espacenet.*
(Continued)

*Primary Examiner* — Richi R Patel
(74) *Attorney, Agent, or Firm* — Nixon & Vanderhye P.C.

(57) ABSTRACT

In one embodiment, an MRI apparatus (20) includes a reference scan setting unit (100), a reference scan execution unit, and an image generation unit. The reference scan setting unit calculates a signal acquisition region of "a reference scan in which MR signals used for generation of a sensitivity distribution map of each coil element are acquired", depending on an imaging region of a main scan of parallel imaging. The reference scan execution unit executes the reference scan on the calculated signal acquisition region. The image generation unit generates image data according to "MR signals acquired by the main scan" and "the sensitivity distribution map generated based on MR signals acquired by the reference scan".

18 Claims, 12 Drawing Sheets

(51) Int. Cl.
*G01R 33/561* (2006.01)
*G01R 33/563* (2006.01)
*G01R 33/54* (2006.01)

(56) References Cited

U.S. PATENT DOCUMENTS

| | | |
|---|---|---|
| 2006/0106299 A1 | 5/2006 | Uchizono et al. |
| 2006/0181278 A1 | 8/2006 | Nozaki |
| 2007/0145978 A1 | 6/2007 | Kuhara |
| 2007/0247159 A1 | 10/2007 | Kuhara |
| 2009/0003674 A1* | 1/2009 | Keupp ............. G01R 33/56375 382/131 |
| 2009/0302839 A1* | 12/2009 | Benschop .......... G01R 33/3415 324/307 |
| 2011/0184273 A1* | 7/2011 | Riederer ............ G01R 33/5611 600/410 |

FOREIGN PATENT DOCUMENTS

| | | |
|---|---|---|
| JP | 2002-010992 | 1/2002 |
| JP | 2004-329613 | 11/2004 |
| JP | 2005-40464 | 2/2005 |
| JP | 2005-237702 | 9/2005 |
| JP | 2005-237703 | 9/2005 |
| JP | 2006-223383 | 8/2006 |
| JP | 2007-319348 | 12/2007 |
| WO | 2003/092497 | 11/2003 |

OTHER PUBLICATIONS

Office Action dated Aug. 25, 2015 in JP 2012-013022.
Office Action dated Aug. 18, 2015 in CN 201310044808.5.
CN Office Action dated Feb. 11, 2015 in in CN 201310044808.5.

* cited by examiner

MAGNETIC RESONANCE IMAGING APPARATUS AND MAGNETIC RESONANCE IMAGING METHOD

CROSS-REFERENCE TO RELATED APPLICATION

This application is based upon and claims the benefit of priority from Japanese Patent Application No. 2012-13022 filed on Jan. 25, 2012;

The entire contents of which are incorporated herein by reference.

BACKGROUND

1. Field of the Invention

Embodiments described herein relate generally to magnetic resonance imaging.

2. Description of the Related Art

MRI is an imaging method which magnetically excites nuclear spin of an object (a patient) set in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal.

In MRI, a fast imaging technology called parallel imaging is known. In parallel imaging, a phased array coil which includes many coil elements is used as an RF coil device set on an object so as to receive MR signals by these coil elements.

In parallel imaging, generally, wraparound artifact occurs as a result of decreasing the number of data acquisition times by thinning out a phase encode step number, and this artifact is compensated in unfolding processing. Specifically, a reference scan is separately performed so as to generate a spatial sensitivity distribution map of each of the coil elements of the phased array coil (for example, see Patent Document 1 and Patent Document 2).

The sensitivity distribution map is, for example, map data indicating how the detection sensitivity of each of the coil elements inside the phased array coil spatially to MR signals varies spatially. Then, the wraparound artifact caused by the decreased phase encode step number is compensated based on the sensitivity distribution map by an appropriate method such as expanding unfolding method (for example, see Patent Document 3).

[Patent Document 1] Japanese Publication of Patent Application No. 2007-319348

[Patent Document 2] Japanese Publication of Patent Application No. 2005-237703

[Patent Document 3] Japanese Publication of Patent Application No. 2004-329613

In conventional technology, an acquisition region of MR signals in a reference scan is (manually) selected by a user as a wide region that infallibly includes the imaging region of the main scan, in order to prevent lack of data for generating the sensitivity distribution map.

Therefore, "MRI technology to enable setting of conditions of a calibration scan without making a user consider a signal acquisition region of a calibration scan" has been desired.

DETAILED DESCRIPTION

Figure 1:
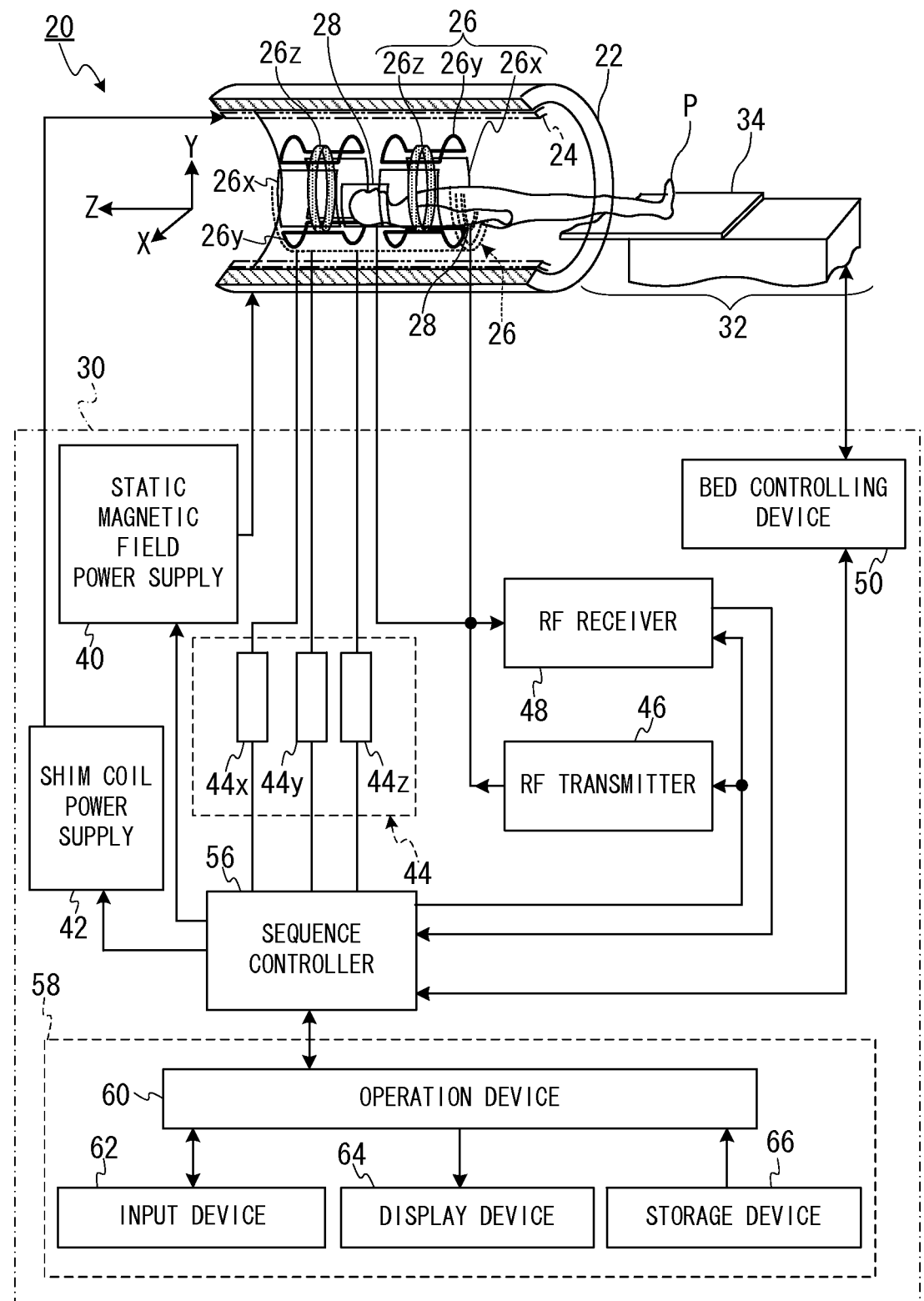
FIG. 1 is a block diagram showing general structure of the MRI apparatus of one embodiment of the present invention.

Hereinafter, examples of aspects which embodiments of the present invention can take will be explained per aspect.

(1) According to one embodiment of the present invention, an MM apparatus executes (performs) parallel imaging in which nuclear magnetic resonance signals are acquired from an object via a multicoil and image data of the object are generated based on the nuclear magnetic resonance signals. The multicoil includes a plurality of coil elements. This MRI apparatus includes a reference scan setting unit, a reference scan execution unit, a main scan execution unit, and an image generation unit.

The reference scan setting unit calculates a signal acquisition region of a reference scan depending on an imaging region of a main scan. The reference scan is a scan to acquire the nuclear magnetic resonance signals received by the plurality of coil elements and used for generation of a spatial sensitivity distribution map of each of the plurality of coil elements.

The reference scan execution unit executes the reference scan on the signal acquisition region calculated by the reference scan setting unit.

The main scan execution unit executes the main scan by acquiring the nuclear magnetic resonance signals from the imaging region of the main scan via the multicoil under a sequence of parallel imaging.

The image generation unit generates the sensitivity distribution map based on the nuclear magnetic resonance signals acquired by the reference scan, and generates the image data of the object based on the nuclear magnetic resonance signals acquired by the main scan and the sensitivity distribution map.

(2) In another embodiment of the present invention, an MRI apparatus includes a main scan execution unit, an image reconstruction unit, a calibration scan setting unit, a calibration scan execution unit, and a condition determining unit.

The main scan execution unit executes operation of transmitting an RF pulse based on determined imaging conditions and acquiring nuclear magnetic resonance signals from an object, as a main scan.

The image reconstruction unit reconstructs image data of the object based on the nuclear magnetic resonance signals acquired by the main scan.

The calibration scan setting unit calculates a signal acquisition region of a calibration scan used for determining an imaging condition of the main scan, a condition of reconstruction processing of the image data, or a condition of correction processing of the image data, depending on an imaging region of the main scan.

The calibration scan execution unit executes the calibration scan by acquiring the nuclear magnetic resonance signals from the signal acquisition region calculated by the calibration scan setting unit.

The condition determining unit determines an imaging condition of the main scan, a condition of reconstruction processing of the image data, or a condition of correction processing of the image data depending on an execution result of the calibration scan.

(3) In another embodiment of the present invention, an MRI method is a method of executing parallel imaging in which nuclear magnetic resonance signals are acquired from an object via a multicoil including a plurality of coil elements and image data of the object are generated based on the nuclear magnetic resonance signals. This MRI method includes the following steps.

One of the steps is to calculate a signal acquisition region of a reference scan in which the nuclear magnetic resonance signals received by the plurality of coil elements and used for generation of a spatial sensitivity distribution map of each of the plurality of coil elements are acquired, depending on an imaging region of a main scan.

Another of the steps is to execute the reference scan on the signal acquisition region.

Another of the steps is to execute the main scan by acquiring the nuclear magnetic resonance signals from the imaging region of the main scan via the multicoil under a sequence of parallel imaging.

Another of the steps is to generate the sensitivity distribution map based on the nuclear magnetic resonance signals acquired by the reference scan.

The other of the steps is to generate the image data of the object based on the nuclear magnetic resonance signals acquired by the main scan and the sensitivity distribution map.

An MRI apparatus and an MRI method according to embodiments of the present invention will be described with reference to the accompanying drawings. Note that the same reference numbers are given for identical components in each figure, and overlapping explanation is abbreviated.

(Configuration of the MRI Apparatus)

FIG. 1 is a block diagram showing general structure of the MRI apparatus 20 according to the present embodiment.

As shown in FIG. 1, the MRI apparatus 20 includes a cylinder-shaped static magnetic field magnet 22 for generating a static magnetic field, a cylinder-shaped shim coil 24 coaxially-arranged inside the static magnetic field magnet 22, a gradient magnetic field coil 26, RF coils 28, a control device 30, and a bed 32. The bed includes a table 34 for placing an object (e.g. a patient) P on it, and the bed 32 movably supports the table 34.

Here, as one example, an apparatus coordinate system, whose X axis, Y axis and Z axis are perpendicular to each other, is defined as follows. Firstly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Additionally, it is assumed that the vertical direction is the same as the Y axis direction. Moreover, the bed 32 is disposed in such a position that the direction of the normal line of the loading plane of its table 34 on which an object is put is the same as the Y axis direction.

The control device 30 includes, for example, a static magnetic field power supply 40, a shim coil power supply 42, a gradient magnetic field power supply 44, an RF transmitter 46, an RF receiver 48, abed controlling device 50, a sequence controller 56 and a computer 58.

The gradient magnetic field power supply 44 includes an X axis gradient magnetic field power supply 44x, a Y axis gradient magnetic field power supply 44y and a Z axis gradient magnetic field power supply 44z.

Additionally, the computer 58 includes an operation device 60, an input device 62, a display device 64 and a storage device 66.

The static magnetic field magnet 22 is electrically connected to the static magnetic field power supply 40 and generates a static magnetic field in an imaging space by using an electric current supplied from the static magnetic field power supply 40.

The aforementioned "imaging space" means, for example, a space in a gantry in which an object P is placed and to which a static magnetic field is applied. The term "gantry" refers to a structure having a cylindrical shape, for example, which includes a static magnetic field magnet 22, a shim coil 24, a gradient magnetic field coil 26, and RF coils 28. The gantry and a bed 32 are configured so that the table 34 on which the object P is placed can move to the inside of the gantry. For simplicity, FIG. 1 does not show the gantry itself but shows its components such as the static magnetic field magnet 22.

The "imaging region" means, for example, a region set as a part of the imaging space and is a range of acquisition of MR signals used to generate one image or one set of image. Here, "one set of images" means, for example, a plurality of images when MR signals of the plurality of images are acquired in a lump in one pulse sequence such as multi-slice imaging. The imaging region is defined three-dimensionally in an apparatus coordinate system, for example.

The static magnetic field magnet 22 includes a superconductivity coil in many cases. The static magnetic field magnet 22 gets an electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The shim coil 24 is electrically connected to the shim coil power supply 42 and uniforms the static magnetic field with the electric current supplied from the shim coil power supply 42.

The gradient magnetic field coil 26 includes an X axis gradient magnetic field coil 26x, a Y axis gradient magnetic field coil 26y and a Z axis gradient magnetic field coil 26z. Each of the X axis gradient magnetic field coil 26x, the Y axis gradient magnetic field coil 26y and the Z axis gradient magnetic field coil 26z is cylinder-shaped and arranged inside the static magnetic field magnet 22.

The X axis gradient magnetic field coil 26x, the Y axis gradient magnetic field coil 26y and the Z axis gradient magnetic field coil 26z are electrically connected to the X axis gradient magnetic field power supply 44x, the Y axis gradient magnetic field power supply 44y and the Z axis gradient magnetic field power supply 44z respectively.

The X axis gradient magnetic field power supply 44x, the Y axis gradient magnetic field power supply 44y and the Z axis gradient magnetic field power supply 44z supply electric currents to the X axis gradient magnetic field coil 26x, the Y axis gradient magnetic field coil 26y and the Z axis gradient magnetic field coil 26z respectively, so as to generate a gradient magnetic field Gx in the X axis direction, a gradient magnetic field Gy in the Y axis direction and a gradient magnetic field Gz in the Z axis direction in the imaging region.

That is, directions of a gradient magnetic field Gss in a slice selection direction, a gradient magnetic field Gpe in a phase encoding direction and a gradient magnetic field Gro in a readout (frequency encoding) direction can be arbitrarily set as logical axises, by combining gradient magnetic fields Gx, Gy and Gz in the X axis, Y axis and Z axis directions as three physical axises.

The gradient magnetic field Gss in the slice selection direction, the gradient magnetic field Gpe in the phase encoding direction, and the gradient magnetic field Gro in the readout direction are superimposed on the static magnetic field.

The RF transmitter 46 generates RF pulses in accordance with control information provided from the sequence controller 56, and outputs the generated RF pulses to the transmission RF coil 28.

The RF coils 28 include a whole body coil WB (see FIG. 4) built in the gantry for transmission and reception of RF pulses and local coils arranged around the table 34 or the object P for reception of RF pulses.

The transmission RF coil 28 transmits an RF pulse given from the RF transmitter 46 to the object P. The reception RF coil 28 receives MR signals generated due to excited nuclear spin inside the object P by the RF pulse, and the MR signals are detected by the RF receiver 48.

The RF receiver 48 generates raw data which are digitized complex number data of MR signals obtained by performing A/D (analogue to digital) conversion after performing predetermined signal processing such as preamplification, intermediate-frequency conversion, phase detection, low-frequency amplification and filtering to the detected MR signals. The RF receiver 48 inputs the generated raw data to the sequence controller 56.

The operation device 60 performs system control of the MRI apparatus 20 in imaging operation, and its function will be explained later with FIG. 2.

The sequence controller 56 stores control information needed in order to make the gradient magnetic field power supply 44, the RF transmitter 46 and the RF receiver 48 drive. The aforementioned control information includes, for example, sequence information describing operation control information such as intensity, impression period and impression timing of the pulse electric current which should be impressed to the gradient magnetic field power supply 44.

The sequence controller 56 generates the gradient magnetic fields Gx, Gy and Gz in the X axis, Y axis and Z axis directions and RF pulses by driving the gradient magnetic field power supply 44, the RF transmitter 46 and the RF receiver 48 according to a predetermined sequence stored. Additionally, the sequence controller 56 receives the raw data of MR signals inputted from the RF receiver 48, and inputs the raw data to the operation device 60.

The bed controlling device 50 is connected to the operation device 60 via the sequence controller 56. The sequence controller 56 moves the table 34 of the bed 32 in the Z axis direction of the apparatus coordinate system by controlling the bed controlling device 50 under the command of the operation device 60. This allows imaging according to a moving-table method or a stepping-table method.

The moving-table method is designed to widen the field of view (FOV) in the direction of movement, by continuously moving the table 34 of the bed 32 in the Z axis direction of the apparatus coordinate system during imaging. The stepping-table method is designed to achieve three-dimensional imaging by moving the table 34 of the bed 32 in a stepped manner for each station. These techniques are used for imaging of a wide area that cannot be imaged at once, such as imaging of the whole body. The operation device 60 also has a capability of combining a plurality of images taken by moving the table 34 into a composite image.

Figure 2:
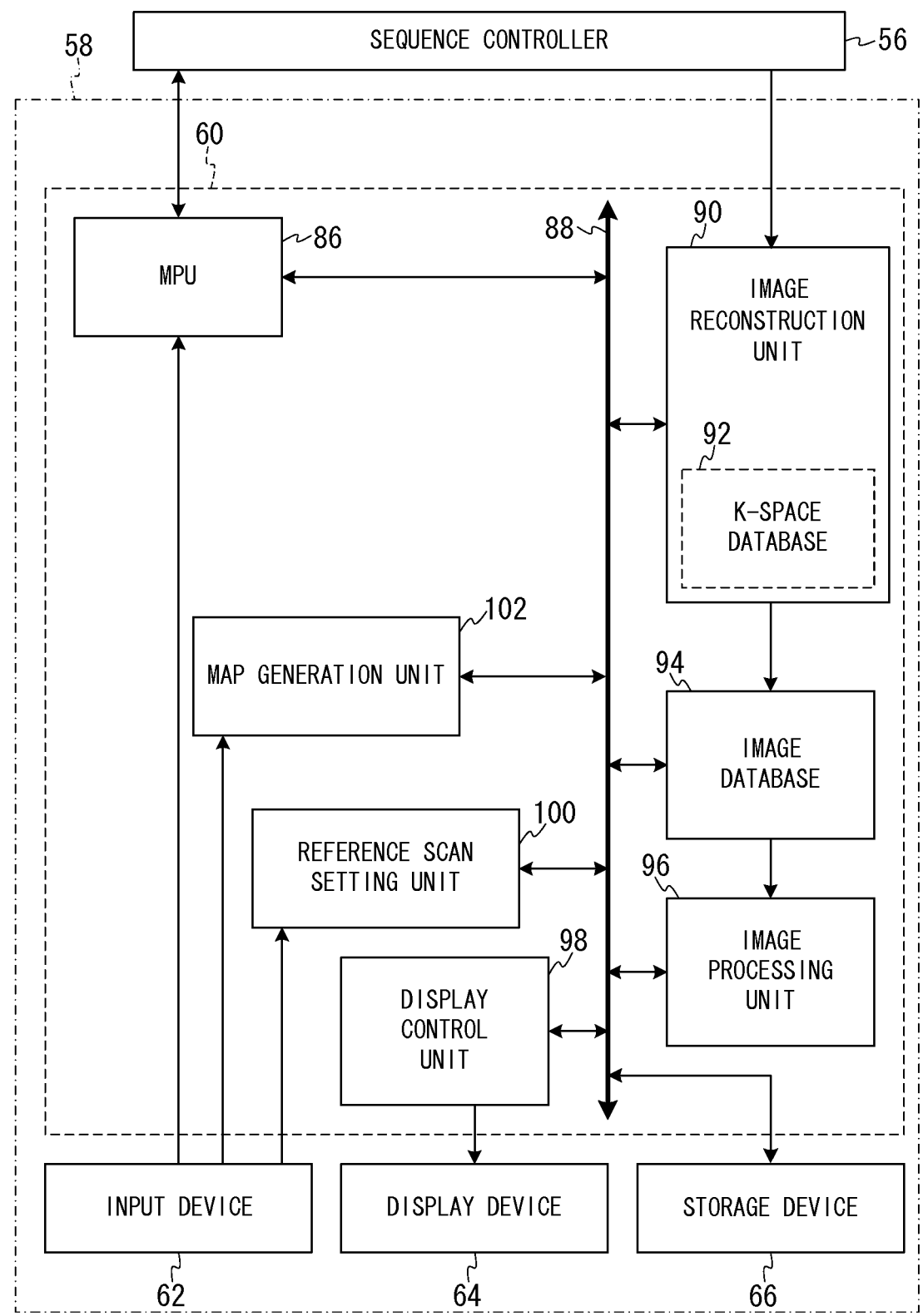
FIG. 2 is a functional block diagram of the computer 58 shown in FIG. 1.

FIG. 2 is a functional block diagram of the computer 58 shown in FIG. 1. As shown in FIG. 2, the operation device 60 of the computer 58 includes an MPU (Micro Processor Unit) 86, a system bus 88, an image reconstruction unit 90, an image database 94, an image processing unit 96, a display controlling unit 98, a reference scan setting unit 100, and a map generation unit 102.

The MPU 86 performs system control of the MRI apparatus 20 in setting of imaging conditions of a main scan, imaging operation and image display after imaging through interconnection such as the system bus 88. Additionally, the MPU 86 functions as imaging conditions setting unit, sets imaging conditions including a pulse sequence based on command information from the input device 62, and inputs the set(installed) imaging conditions into the sequence controller 56.

The aforementioned term "imaging condition" refers to under what condition an RF signal or the like is transmitted in what type of pulse sequence, such as of spin echo or gradient echo, or under what condition MR signals are acquired from an object, for example. As a parameter of the imaging conditions, for example, there are the imaging region as positional information in the imaging space, a slice number, and an imaging part. The "imaging part" means a region of the object P to be imaged, such as a head, a chest, and an abdomen.

The aforementioned "main scan" is a scan for imaging an intended diagnosis image such as a T1 weighted image, and it does not include a scan for acquiring MR signals for a scout image or a calibration scan. A scan is an operation of acquiring MR signals, and it does not include image reconstruction processing.

The calibration scan is a scan for determining unconfirmed elements of imaging conditions, conditions and data used for image reconstruction processing or correction processing after the image reconstruction processing and so on, and it is performed separately from the main scan. The aforementioned reference scan is an example of the calibration scan. The reference scan can be performed not only before the main scan but also after the main scan. As an example here, a calibration scan which is performed before the main scan is referred to as a prescan.

Figure 13:
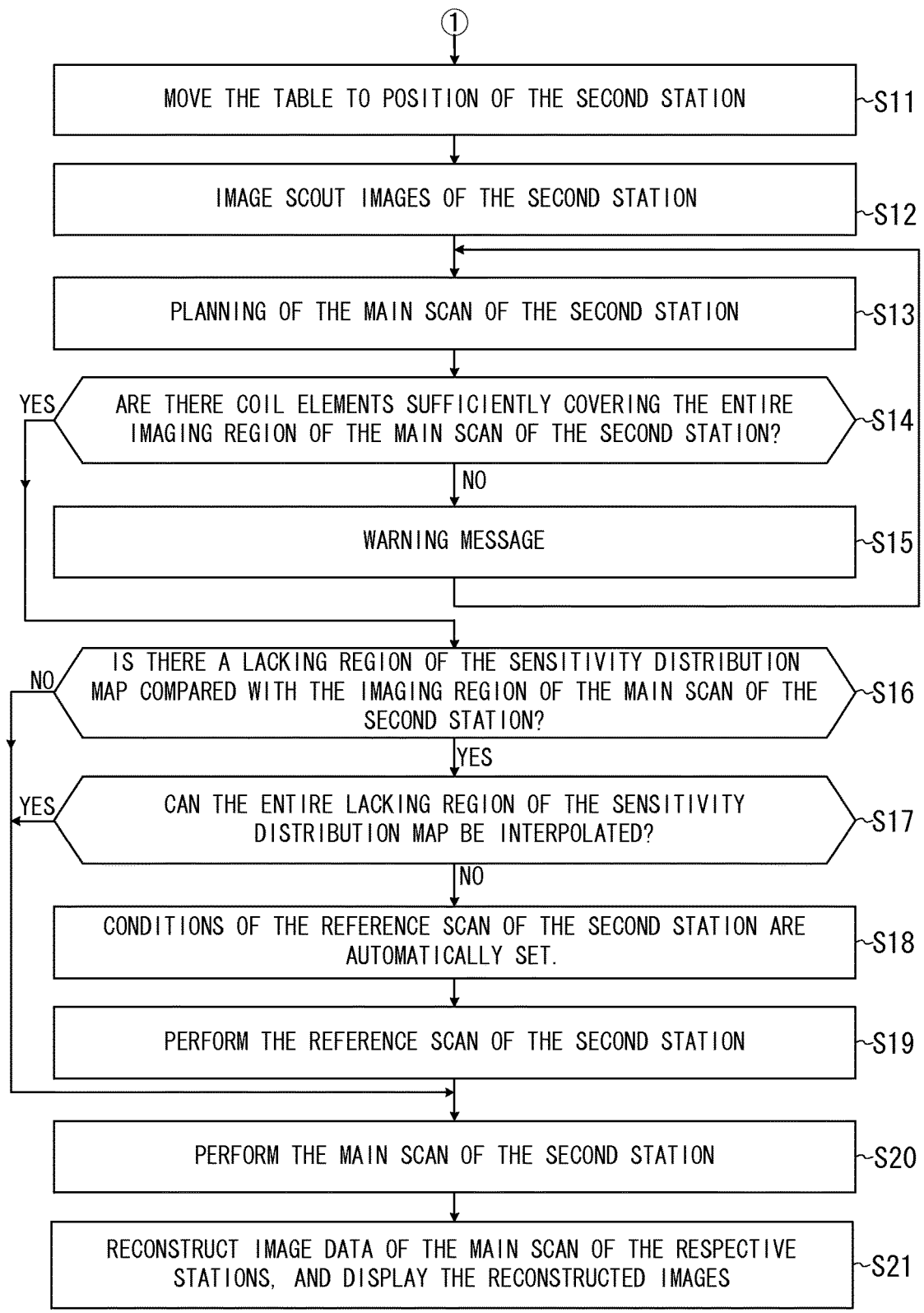
FIG. 13 is a flowchart illustrating a flow of the posterior half of the process following FIG. 12 performed by the MRI apparatus of the present embodiment.

Although a sensitivity distribution map is used as a part of image reconstruction processing of parallel imaging in the after-mentioned step S21 in FIG. 13, this is only an example. In the case of another pulse sequence in which the phase encode step is not decreased, the sensitivity distribution map may be used for luminance correction processing on (once) reconstructed image data (this luminance correction processing is an example of the aforementioned "correction processing").

The MPU 86 controls the display controlling unit 98 and displays screen information for setting imaging conditions on the display device 64.

The input device 62 provides a user with a function to set imaging conditions and image processing conditions.

The image reconstruction unit 90 includes a k-space database 92 inside. The image reconstruction unit 90 arranges raw data of MR signals inputted from the sequence controller 56 in the k-space formed in the k-space database 92 as k-space data. The k-space means a frequency space. The image reconstruction unit 90 generates image data of each slice of the object P by performing image reconstruction processing including such as two-dimensional Fourier transformation. The image reconstruction unit 90 stores the generated image data in the image database 94.

The image processing unit 96 takes in the image data from the image database 94, performs predetermined image processing on them, and stores the image data after the image processing in the storage device 66 as display image data.

The storage device 66 stores the display image data after adding accompanying information such as imaging conditions used for generating the display image data and information of the object P (patient information) to the display image data.

The display controlling unit 98 displays a screen for setting imaging conditions and an image indicated by generated display image data through imaging on the display device 64 under control of the MPU 86.

The reference scan setting unit 100 sets conditions of a reference scan for generating a spatial sensitivity distribution map of each coil element of a phased array coil in parallel imaging. In a reference scan, MR signals from the object P are detected and acquired via each of the coil elements inside the phased array coil set on the object P.

Additionally, the reference scan setting unit 100 corrects (modifies) positional information of an existence region of the sensitivity distribution map according to the movement of the table 34 on which the object P is set, and retains (stores) the corrected positional information of the existence region of the sensitivity distribution map during imaging of the same object P. When imaging of another object is started by, for example, setting another object on the table 34, the reference scan setting unit 100 deletes the positional information of the existence region of the sensitivity distribution map of the previous object P.

The map generation unit 102 generates a spatial sensitivity distribution map of each of the coil elements of the phased array coil based on MR signals acquired (collected) in a reference scan.

Note that calculation and setting of undetermined imaging conditions and calculation (generation) of conditions and data used for image reconstruction processing or processing after the image reconstruction processing by each component of the operation device 60 are preformed automatically. For example, generation processing of the sensitivity distribution map by the map generation unit 102, and calculation and setting of the signal acquisition region of a reference scan by the reference scan setting unit 100 are preformed automatically. However, as to setting of conditions, data and so on, the present embodiment is not limited to an aspect in which they are completely automatically performed by the operation device 60. For example, automatically calculated conditions may be displayed on the display device 64, and the operation device 60 may determine the conditions to the displayed conditions after receiving a confirm input (command) by a user via the input device 62 (that is, the operation device 60 may be configured in such a manner that all the processes except final confirm by a user are performed automatically).

Figure 3:
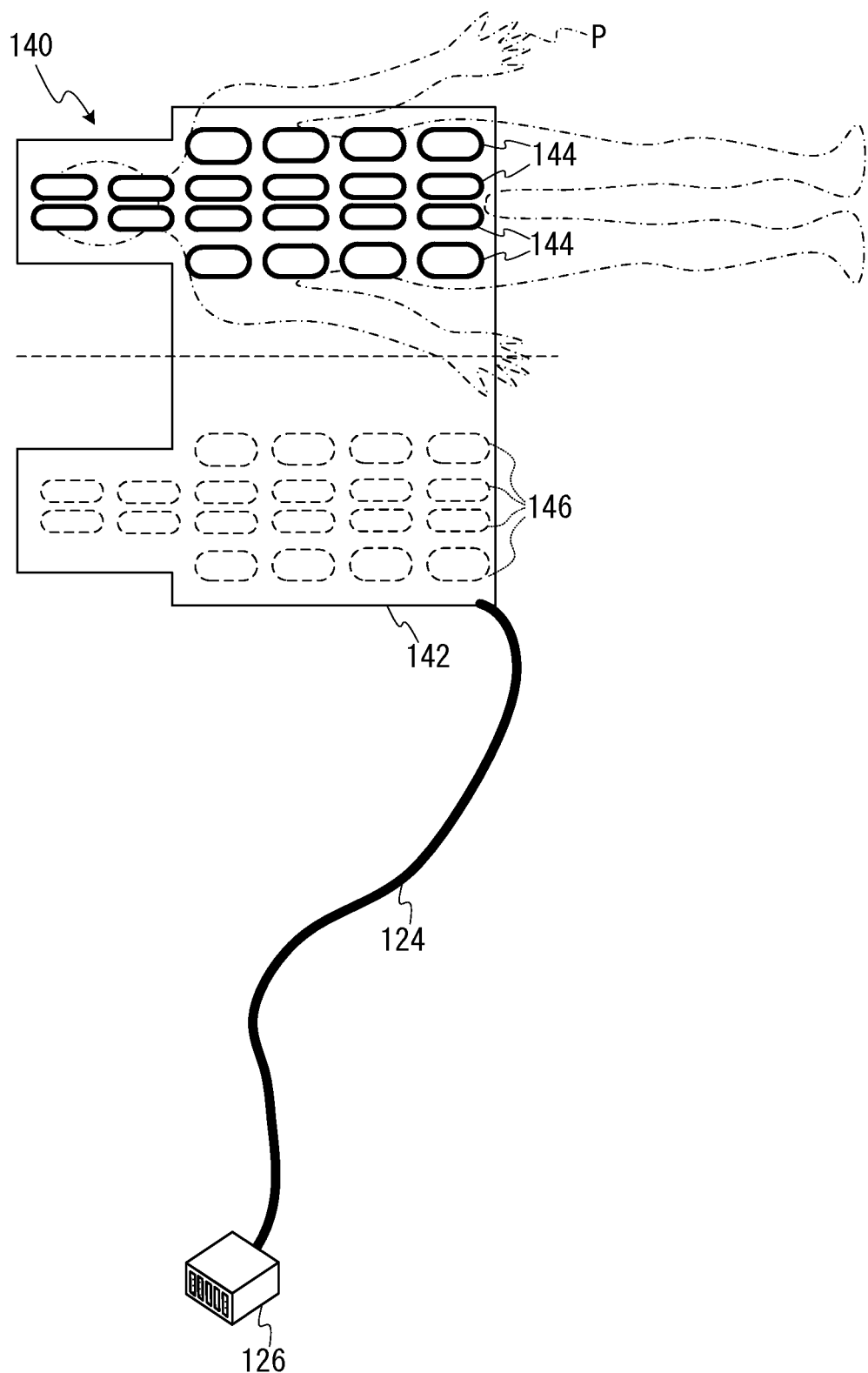
FIG. 3 is a schematic planimetric diagram showing an example of structure of an upper body RF coil device, as an example of a wearable RF coil device detecting MR signals.

FIG. 3 is a schematic planimetric diagram showing an example of structure of an upper body RF coil device 140, as an example of a wearable RF coil device detecting MR signals.

As shown in FIG. 3, the upper body RF coil device 140 includes a cover member 142, the cable 124 and a connector 126. The cover member 142 is made of a flexible material and is capable of deformation such as folding. As such a flexible material, for example, a flexible circuit board (Flexible Printed Circuit: FPC) described in Japanese Patent Application Laid-open (KOKAI) Publication No. 2007-229004 can be used.

For example, twenty of coil elements (surface coils) 144 corresponding to the back side of the object P are disposed inside the upper half of the cover member 142 bisected by the horizontal dashed line in FIG. 3. As an example here, a plurality of the coil elements 144 smaller than the rest of the coil elements 144 are arranged near the body axis, in terms of sensitivity improvement considering the backbone of the object P.

The bisected lower half of the cover member 142 is composed so as to overlay the head part, the chest part and the abdominal part of the object P. For example, twenty of coil elements (surface coils) 146 corresponding to the anterior side of the object P are disposed inside the lower half of the cover member 142. In FIG. 3, the coil elements 144 are shown by bold lines and the coil elements 146 are shown by dashed lines.

The coil elements 144 and 146 are electrically connected to discrete lines in the cable 124 separately by heretofore known circuits including an amplifier circuit and the like inside the cover member 142 (not shown). When the connector 126 is connected to the connection port of the MRI apparatus 20, the coil elements 144 and 146 are connected to the RF receiver 48 via the cable 124.

Additionally, the upper body RF coil device 140 includes a control circuit (not shown) and a memory element (not shown) storing identification information of the upper body RF coil device 140, inside the cover member 142. When the connector 126 is connected to the connection port of the MRI apparatus 20, the identification information of the upper body RF coil device 140 is inputted from the control circuit into the MPU 86 via hard-wirings inside the MRI apparatus 20.

Figure 4:
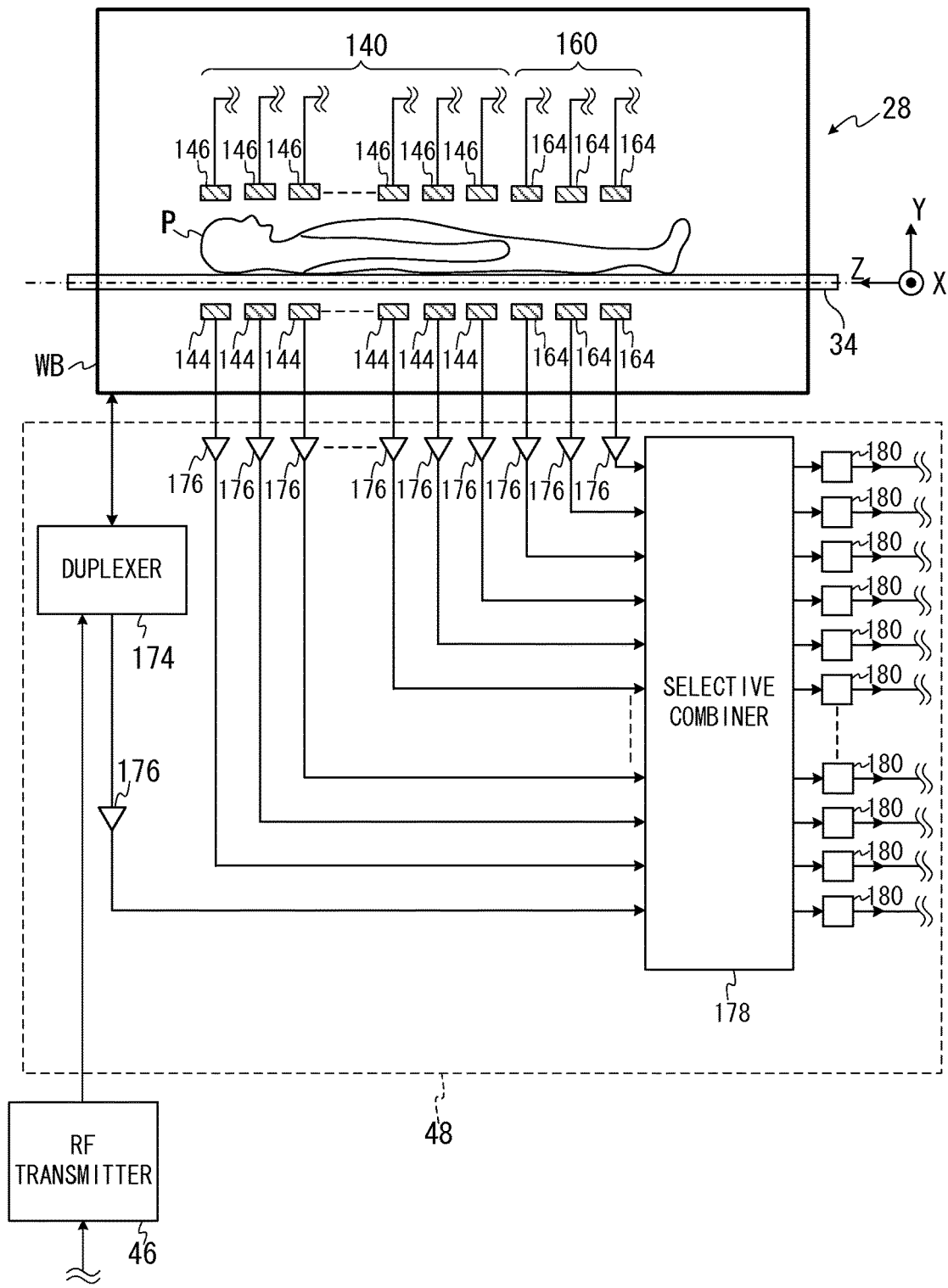
FIG. 4 is a block diagram showing an example of detailed structure of the RF receiver in FIG. 1.
Figure 5:
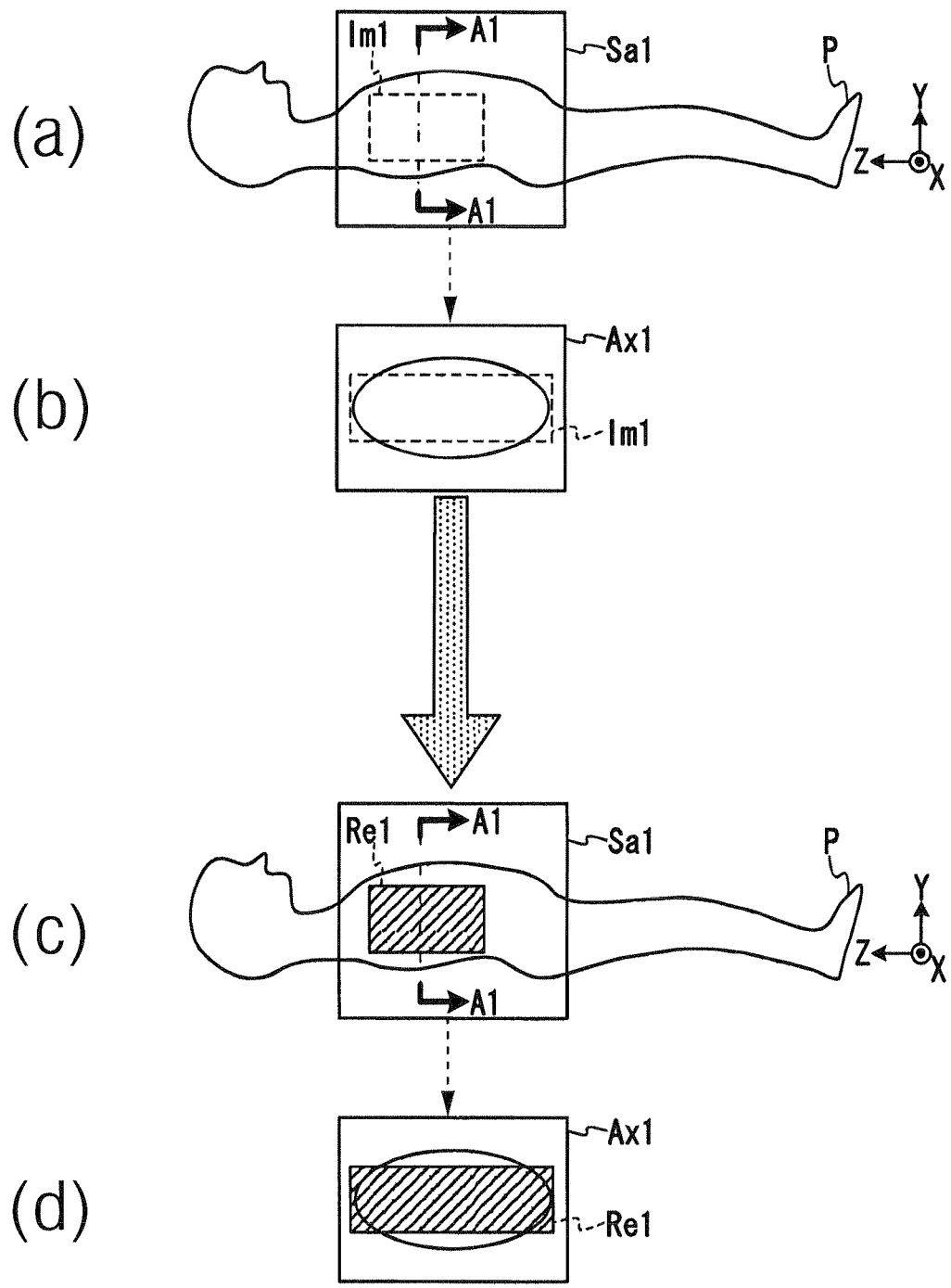
FIG. 5 is an explanatory diagram showing an example of a calculating method of a signal acquisition region of a reference scan, when the sensitivity distribution map does not exist for any parts of the imaging region of the main scan.

FIG. 4 is a block diagram showing an example of detailed structure of the RF receiver 48 in FIG. 1. As an example here, it is assumed that the upper body RF coil device 140 and a wearable lower body RF coil device 160 receiving MR signals are set on the object P and function as a phased array coil. The lower body RF coil device 160 includes many coil elements 164 detecting MR signals (for simplicity, only six coil elements 164 are shown in FIG. 5).

In this case, the RF coil 28 includes a cylinder-shaped whole body coil WB shown as a rectangle shown by a bold line in the drawing, the coil elements 144, 146 of the upper body RF coil device 140, and the coil elements 164 of the lower body RF coil device 160. The coil elements 144, 146 and 160 detect MR signals. The whole body coil WB is arranged inside the gantry and is capable of both transmitting RF pulses and receiving MR signals as a bidirectional coil.

The RF receiver 48 includes a duplexer 174, a plurality of amplifiers 176, a selective combiner 178, and a plurality of receiving-system circuits 180. The input side of the selective combiner 178 is separately connected to the coil elements 144, 146 and 164 via the amplifiers 176. The input side of the selective combiner 178 is separately connected to the whole body coil WB via the duplexer 174 and the amplifier 176. The receiving-system circuits 180 are individually connected to the output side of the selective combiner 178.

The duplexer 174 receives an RF pulse from the RF transmitter 46, and transmits the received RF pulse to the whole body coil WB. Additionally, the duplexer 174 inputs MR signals received by the whole body coil WB to the amplifier 176, and the MR signals are amplified by the amplifier 176 and then provided to the input side of the selective combiner 178. The MR signals received by the coil elements 144, 146 and 164 are also amplified by their respective amplifiers 176 and then provided to the input side of the selective combiner 178.

The selective combiner 178 performs selection and synthesis of the MR signals detected by the coil elements 144, 146, 164 and the whole body coil WB depending on the number of the receiving-system circuits 180, and outputs the resulting signals to corresponding receiving-system circuits 180 respectively. In this way, the MRI apparatus 20 produces a sensitivity distribution suitable for each imaging part by using the whole body coil WB and a desired number of the coil elements 144, 146, 164, and receives MR signals from various imaging parts.

Note that, the MRI apparatus 20 can receive MR signals by using only the whole body coil WB, without arranging the coil elements 144, 146 and 164. However, in the following explanation, a case in which one or a plurality of wearable RF coil device (s) is (are) used will be described as an example. Additionally, MR signals detected by the whole body coil WB and the coil elements 144, 146 and 164 may be directly inputted to the receiving-system circuits 180, omitting the selective combiner 178. Moreover, more number of the coil elements may be disposed over a wide range.

Note that, it is assumed that the coil elements 144, 146 of the upper body RF coil device 140, and the coil elements 164 of the lower body RF coil device 160 are a part of the MRI apparatus 20, in the above explanation. However, this is for convenience of explanation. (Each coil element of) The upper body RF coil device 140 and/or the lower body RF coil device 160 may be regarded as a separate part independent of the MRI apparatus 20.

FIG. 5 is an explanatory diagram showing an example of a calculating method of the signal acquisition region of a reference scan, when a reference scan has not been performed for any parts of the imaging region of the main scan (when the sensitivity distribution map does not exist for any parts of the imaging region of the main scan).

FIG. 5 (A) indicates the imaging region Im1 of the main scan of parallel imaging set on the sagittal cross-section Sa1. FIG. 5 (B) indicates the imaging region Im1 in the axial cross-section Ax1 of the patient coordinate system which is a transverse section in the A1-A1 direction of FIG. 5 (A). FIG. 5 (C) indicates the signal acquisition region Re1, which is set by the reference scan setting unit 100 on the above sagittal cross-section Sa1. FIG. 5 (D) indicates the signal acquisition region Re1 in the above axial cross-section Ax1.

In the present embodiment, as an example, the X axis, the Y axis and the Z axis of the patient coordinate system are defined as follows (see FIG. 5(A) and FIG. 5(C)). That is, the left-right direction of the object P is defined as the X axis direction. And front-to-rear direction of the object P is defined as the Y axis direction, assuming that the abdominal side is the front and the back side is the rear. And topside-to-downside direction of the object P is defined as the Z axis direction, assuming that the head side is topside and foot side is downside along the direction of a straight-line approximation of the backbone.

Additionally, an X-Y plane of the patient coordinate system is defined as an axial plane, an X-Z plane of the patient coordinate system is defined as a coronal plane, and a Y-Z plane of the patient coordinate system is defined as a sagittal plane.

As an example here, the magnetic field center in the gantry of the MRI apparatus 20 is the original point of the apparatus coordinate system, and the original point of the apparatus coordinate system is equal to the original point of the patient coordinate system.

Additionally, as an example, the object P is set on the table 34 in such a manner that the body axis (straight-line approximation of the backbone) accords with the Z axis of the apparatus coordinate system. That is, each of the extending directions of a X-Y plane (axial plane), a X-Z plane (coronal plane), and a Y-Z plane (sagittal plane) accords with each other between the apparatus coordinate system and the patient coordinate system. However, the above assumption is only an example for simplifying the explanation, and the directions of basic three axises of X, Y, Z and the original point do not need to accord with each other between the apparatus coordinate system and the patient coordinate system.

Here, as to calculation of the signal acquisition region of the reference scan, an existence region of the sensitivity distribution map is assumed as follows, for example. That is, when there is a region having undergone a reference scan, the reference scan setting unit 100 calculates the signal acquisition region on the assumption that the sensitivity distribution map for this region has already been generated even if the sensitivity distribution map for this region has not been generated. This is because if MR signals as a reference scan have been acquired from this region, the sensitivity distribution map can be generated afterward even if the sensitivity distribution map for this region has not been generated.

However, when the sensitivity distribution map is generated by using the MR signals acquired in the reference scan immediately after executing the reference scan, the signal acquisition region of the reference scan may be calculated on the assumption that "the existence region of the sensitivity distribution map" is only the region for which actual data of the sensitivity distribution map exists. In the aftermentioned flow of FIG. 12 and FIG. 13, such a case will be explained.

When any part of the imaging region Im1 of the main scan has not undergone the reference scan and the sensitivity distribution map does not exist for any part of the imaging region Im1, the reference scan setting unit 100 calculates (determines) the same region as the imaging region Im1 as a lacking region. The lacking region means a region which lacks the sensitivity distribution map as compared with the imaging region of the main scan in relation to the same object.

The aforementioned "in relation to the same object" means a restriction in terms of the following point. That is, even if the sensitivity distribution map exists in the imaging performed before imaging of the current target object, such a sensitivity distribution map cannot be used for another object (i.e. the current target object).

As shown in FIG. 5(A), FIG. 5(B), FIG. 5(C) and FIG. 5(D), the reference scan setting unit 100 sets the above lacking region (which is the same as the imaging region Im1 in the case of FIG. 5) as the signal acquisition region Re1 of the reference scan.

Here, if a combination method (combination conditions) of the coil elements used for the reference scan is different from combination method of the coil elements used for the main scan, the following problem may occur. That is, there is a possibility that the wraparound artifact is not appropriately eliminated in the unfolding processing due to influence of mutual coupling of the coil elements and so on. Then, in the present embodiment, acquisition of MR signals from the signal acquisition region of the reference scan is performed by using the combination method of the coil elements used for the main scan. The aforementioned "combination method" means, for example, a combination determined by the following conditions.

(1) Which coil element(s) in the phased array coil is(are) selected?

(2) Is each of the coil elements used as <A> a QD (quadrature detection) coil, <B> a surface coil of coordinate phase, or <C>, a surface coil of antiphase?

(3) In what channel structure is each of the coil elements electrically connected to the RF receiver 48?

The above "select" in (1) means that MR signals received by the selected coil elements are acquired by the RF receiver 48 as data and used for generation of the sensitivity distribution map.

Additionally, the above "channel" in (3) means each pathway of a plurality of MR signals from each RF coil device to the RF receiver 48 (these MR signals are outputted from each RF coil device such as a phased array coil and inputted to the RF receiver 48). Specifically, the number of "channel" is set to a number equal to or less than the receivable input number of the RF receiver 48. Thus, "an analogue MR signal transmitted in each channel and inputted to the RF receiver 48 as one signal" consists of an MR signal of one coil element in some cases, or it is a composite signal of respective MR signals of a plurality of coil elements in other cases. That is, when twenty of the coil elements are disposed in the phased array coil and the RF receiver 48 side has only three channels as an example, coil elements are selected depending on which coil element(s) is (are) connected to the RF receiver 48.

Additionally, although "the lacking region" is set as the signal acquisition region Re1 of the reference scan in the above example, "a slightly expanded region of the lacking region" may be set as the signal acquisition region of the reference scan. The above "slightly expanded (region)" is a range over which detection sensitivity of the coil elements used in the reference scan extends, and is a range including the lacking region. It is preferable that the above "slightly expanded region" should be wide enough to make the exterior edge of the sensitivity distribution map include a surrounding area of the object. The reason why it is preferable that outside of the object should be included in the sensitivity distribution map is as follows. That is, outside of the object is air and its intensity of MR signals is low, and the following information can be obtained by including such an outside region of the object in the sensitivity distribution map. That is, "where is the border line between the object and its outside region emitting ignorable MR signals" will be obtained.

Additionally, the above a range which detection sensitivity extends over means, for example, the following range. That is, MR signals generated in this range can be detected with sensitivity accurate enough to obtain an image of sufficient image quality without causing any diagnostic problem.

Figure 6:
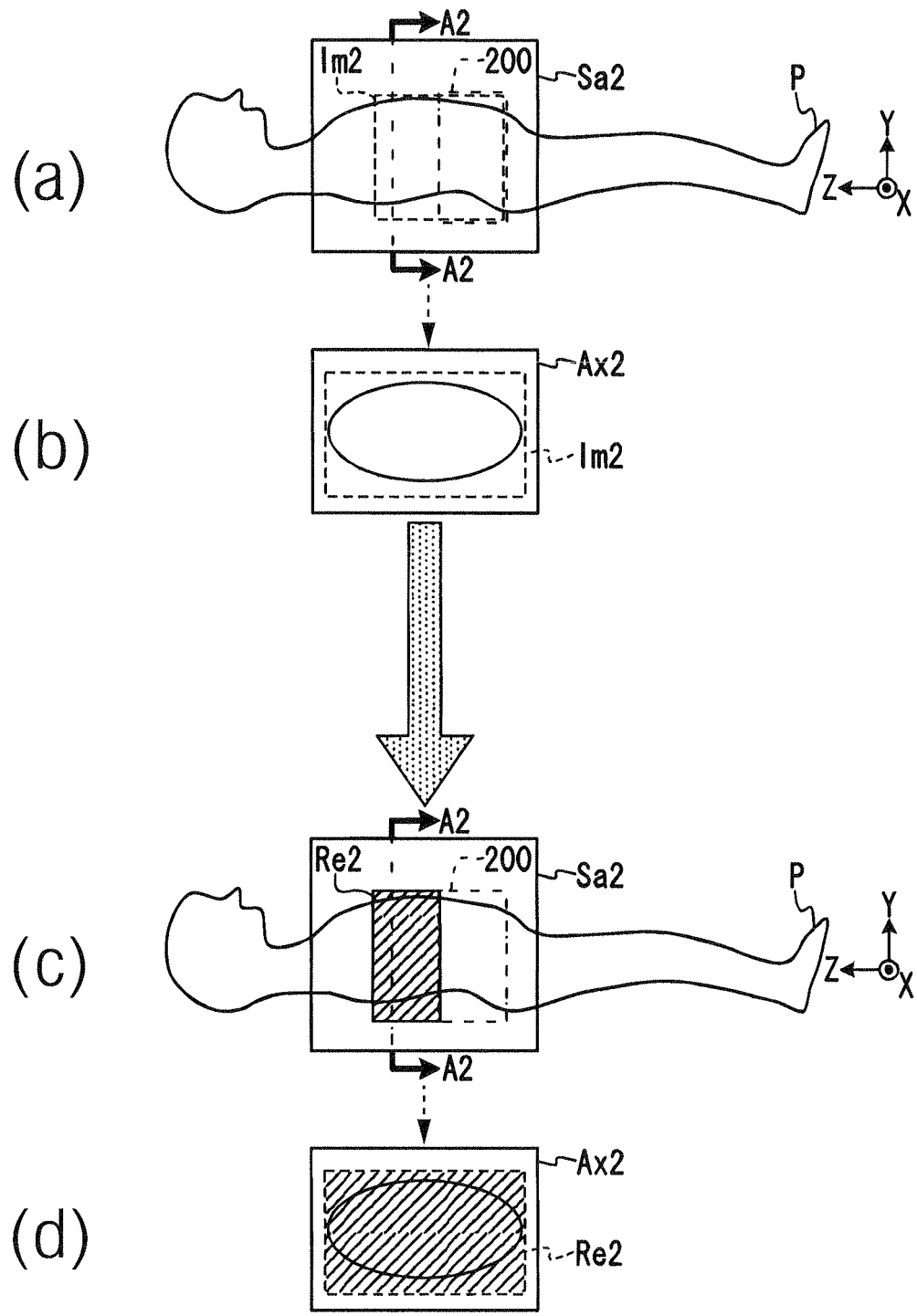
FIG. 6 is an explanatory diagram showing an example of a calculating method of the signal acquisition region of a reference scan, when the sensitivity distribution map exists for a part of the imaging region of the main scan.

FIG. 6 is an explanatory diagram showing an example of a calculating method of the signal acquisition region of a reference scan, when the sensitivity distribution map exists for a part of the imaging region of the main scan. Note that, FIG. 6 includes a case where a reference scan has already been performed for a part of the imaging region Im2 and the sensitivity distribution map based on MR signals obtained in this reference scan has not been generated.

FIG. 6(A) indicates the imaging region Im2 of the main scan of parallel imaging set on the sagittal cross-section Sat of the patient coordinate system with a dotted frame, and indicates the existence region 200 of the sensitivity distribution map (a region having undergone a reference scan) with a dashed-dotted frame. In this example, approximately right half of the imaging region Im2 in the sagittal cross-section is the existence region 200 of the sensitivity distribution map.

FIG. 6(B) indicates the imaging region Im2 in the axial cross-section Ax2 of the patient coordinate system which is a transverse section in the A2-A2 direction of FIG. 6(A), with a dotted frame. In FIG. 6(B), the solid ellipse inside the axial cross-section Ax2 indicates the outline form of the object P.

FIG. 6(C) indicates the signal acquisition region Re2 of the reference scan set by the reference scan setting unit 100 on the above the sagittal cross-section Sat with a shaded area, and indicates the region 200 having undergone a reference scan with a dashed-dotted frame.

FIG. 6 (D) indicates the signal acquisition region Re2 in the above axial cross-section Ax2 with a dashed frame. In the case of FIG. 6, the reference scan setting unit 100 calculates a region obtained by eliminating the existence region 200 of the sensitivity distribution map from the imaging region Im2 as the lacking region, and sets this lacking region as the signal acquisition region Re2 of the reference scan (see FIG. 6 (A), FIG. 6 (B), FIG. 6 (C) and FIG. 6 (*d*)). In the example of FIG. 6, the lacking region (the signal acquisition region Re2) in the sagittal cross-section is an approximately left half of the imaging region Im2.

However, when a part of the imaging region Im2 has undergone a reference scan and the sensitivity distribution map based on this reference scan has not been generated, the reference scan setting unit 100 sets "the region obtained by subtracting the region 200 having undergone a reference scan from the imaging region Im2" as the signal acquisition region Re2 in the way similar to the aforementioned manner.

Figure 7:
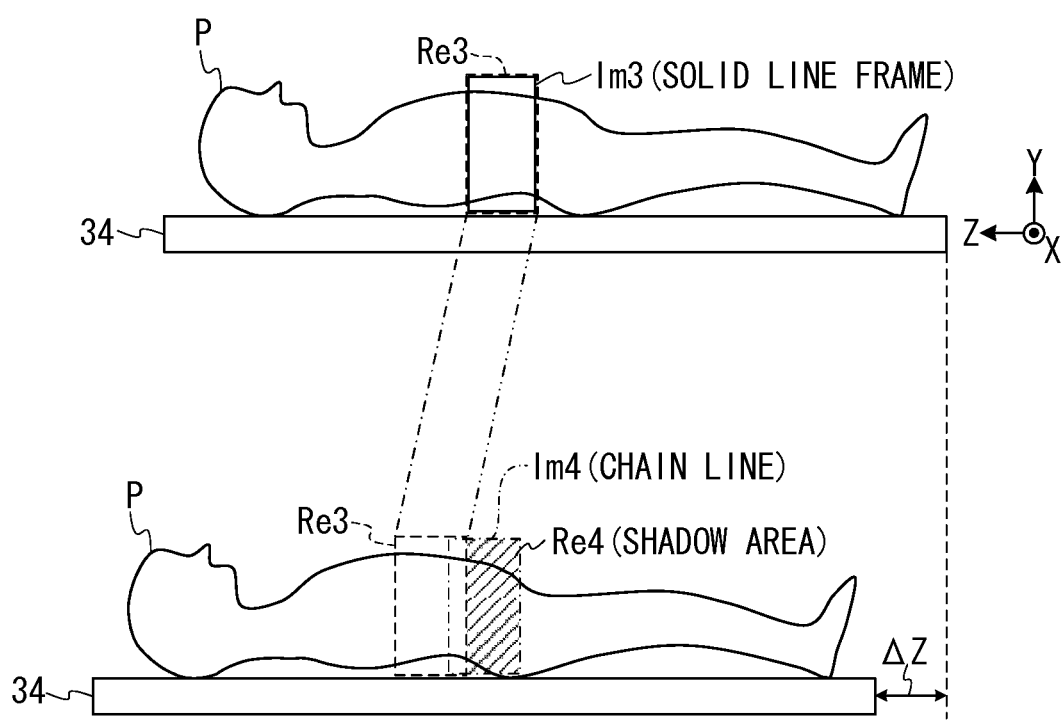
FIG. 7 is an explanatory diagram showing an example of a calculating method of the signal acquisition region of a reference scan with a sagittal cross-section, when the table moves during imaging.

FIG. 7 is an explanatory diagram showing an example of a calculating method of the signal acquisition region of a reference scan with a sagittal cross-section in the patient coordinate system and the apparatus coordinate system, when the table moves during imaging. Generally, for example, the best image quality will be obtained by performing imaging in the vicinity of the center of the gantry which is also a position of the magnetic field center fixed in the apparatus coordinate system. Then, it is preferable to set the imaging region of the main scan each time the table 34 moves, in such a manner that the each imaging region of the respective main scans includes the magnetic field center.

In the upper side of FIG. 7, the imaging region Im3 of the main scan set before movement of the table 34 is indicated with a solid frame. Additionally, in the upper side of FIG. 7, the signal acquisition region Re3 of a reference scan set for the imaging region Im3 in the way explained with FIG. 5 is indicated with a dashed frame. In the example of FIG. 7, the imaging region Im3 is identical to the signal acquisition region Re3.

As an example here, it is assumed that the imaging region of the main scan and the signal acquisition region of the reference scan are rectangular parallelopiped regions, and their ranges (positional information) are defined by their coordinates of all the eight vertexes in the apparatus coordinate system.

On the above assumption, consider a case where the reference scan on the signal acquisition region Re3 and the main scan on the imaging region Im3 have finished, and then the table 34 has moved by ΔZ in the Z axis direction of the apparatus coordinate system. In this case, the reference scan setting unit 100 corrects (modifies) the stored positional information of the signal acquisition region Re3 of the reference scan in tandem with the movement of the table 34.

As an example here, the reference scan setting unit 100 shifts each Z coordinate value of every vertex of the signal acquisition region Re3 in the apparatus coordinate system by ΔZ. Note that, as to the positional information of the signal acquisition region having undergone a reference scan and the positional information of the region for which the sensitivity distribution exists, both may be treated only in the apparatus coordinate system in the above manner (without conversion). However, these regions may be converted into the patient coordinate system and calculated in the patient coordinate system.

In the lower side of FIG. 7, the signal acquisition region Re3 corrected after the aforementioned movement of the table 34 is indicated with a dashed frame. In the lower side of FIG. 7, the imaging region Im4 of another main scan newly set after the movement of the table 34 is indicated with a dashed-dotted frame. In this case, the reference scan setting unit 100 calculates and sets the signal acquisition region Re4 of a reference scan for the imaging region Im4 in the way similar to FIG. 6. In the example of FIG. 7, three quarters of the imaging region Im4 are the signal acquisition region Re4.

That is, the reference scan setting unit 100 calculates an overlap region between the imaging region Im4 of the main scan and the signal acquisition region Re3 having undergone a reference scan, and sets the region obtained by subtracting this overlap region from the imaging region Im4 as the signal acquisition region Re4 of the reference scan.

As described above, in parallel imaging of the present embodiment, when a station is moved by the movement of the table 34, the signal acquisition region of a reference scan is set in such a manner that the sensitivity distribution map is not redundantly generated. That is, a reference scan is performed only on the deficient range judging from the imaging region of the main scan and the existence region of the sensitivity distribution map or the region having undergone a reference scan. However, in the present embodiment, as an example, even if a lacking region of the sensitivity distribution map exists, a reference scan for this lacking region is not performed in the case where the sensitivity distribution map of this lacking region can be interpolated by using the previously generated sensitivity distribution map.

Figure 8:
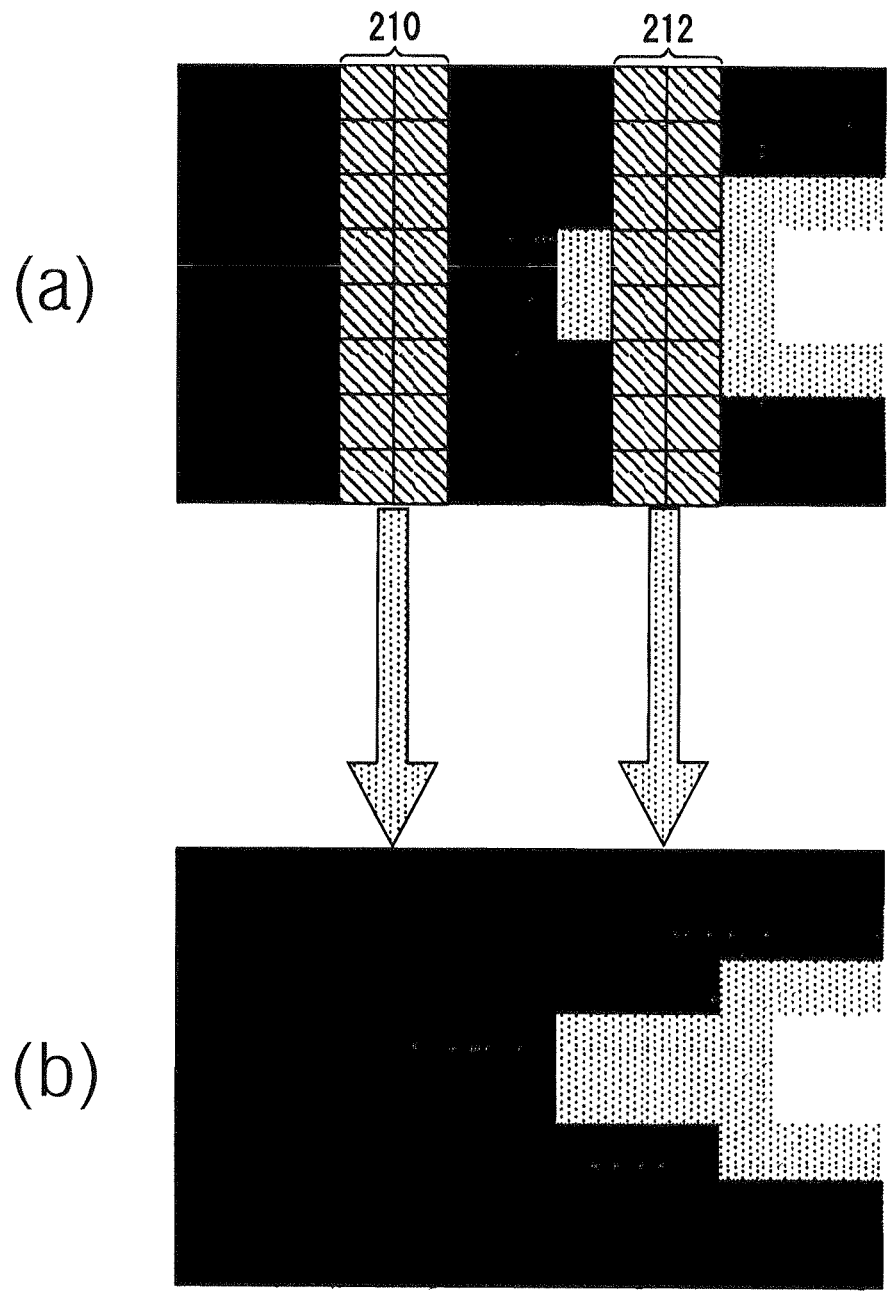
FIG. 8 is an explanatory diagram showing an example of a generation method of the sensitivity distribution map by interpolating non-existent region of the sensitivity distribution map with the use of the previously obtained sensitivity distribution map.

FIG. 8 is an explanatory diagram showing an example of a generation method of the sensitivity distribution map by interpolating non-existent region of the sensitivity distribution map with the use of the previously obtained sensitivity distribution map. The sensitivity distribution map is, for example, composed of volume data for a three-dimensional range. However, for simplicity of explanation here, the sensitivity distribution map is assumed to be two-dimensional data. In this case, the sensitivity distribution map is, for example, image data whose pixels corresponding to respective spatial positions respectively have pixel values depending on detection sensitivity to MR signals.

FIG. 8(A) indicates the sensitivity distribution map before interpolation, and FIG. 8(B) indicates the sensitivity distribution map after interpolation. In FIG. 8(A) and FIG. 8(B), pixels corresponding to positions of higher detection sensitivity to MR signals are indicated more whitely, and pixels corresponding to positions of lower detection sensitivity to MR signals are indicated more blackly. That is, the higher the pixel value of a pixel is, the more whitely this pixel is indicated. In FIG. 8 (A), the shadow regions 210 and 212 consisting of sixteen pixels respectively are regions for which the sensitivity distribution maps do not exist.

The map generation unit 102 judges whether or not the sensitivity distribution maps for the shadow regions 210 and 212 can be interpolated based on the sensitivity distribution map of the regions adjacent to the shadow regions 210 and 212 in FIG. 8(A) by using interpolation methods such as linear interpolation of distance and nonlinear interpolation of distance (see Patent Document 2), for example. When the map generation unit 102 judges that the sensitivity distribution maps for the shadow regions 210 and 212 can be interpolated, the map generation unit 102 generates the sensitivity distribution maps for the shadow regions 210 and 212 by interpolation. FIG. 8(B) shows this state.

Additionally, in the present embodiment, when any coil element does not exist in a position capable of receiving MR signals from the imaging region of the main scan with sufficient detection sensitivity, that effect is notified and neither the reference scan nor the main scan is performed.

Figure 9:
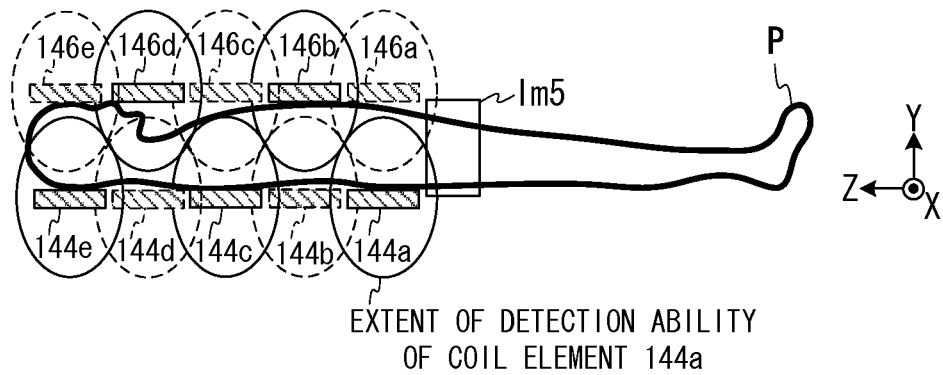
FIG. 9 is an explanatory diagram showing an example of a positional relationship between each of the coil elements of the phased array coil set on the object and the imaging region of the main scan by using a sagittal cross-section.

FIG. 9 is an explanatory diagram showing an example of a positional relationship between each of the coil elements of the phased array coil set on the object P and the imaging region Im5 of the main scan by using a sagittal cross-section of the patient coordinate system and the apparatus coordinate system. As an example here, the coil elements 144a, 144b, 144c, 144d and 144e are arranged in the back side of the object P, and the coil elements 146a, 146a, 146c, 146d and 146e are arranged in the front side of the object P. In FIG. 9, the solid ellipse including the coil elements 144a at its center indicates a range over which detection sensitivity of the coil elements 144a extends. The meaning of a range over which detection sensitivity extends is the same as before.

Similarly, each solid ellipse including the respective coil elements 146b, 144c, 146d and 144e at their center indicates each range over which detection sensitivity of each of the coil elements 146b, 144c, 146d and 144e extends. Similarly, each dashed ellipse including the respective coil elements 146a, 144b, 146c, 144d and 146e at their center indicates each range over which detection sensitivity of each of the coil elements 146a, 144b, 146c, 144d and 146e extends.

The range over which detection sensitivity of the coil elements 144a to 144e and the coil elements 146a to 146e arranged in FIG. 9 covers a part of the imaging region Im5 of the main scan having been set, but it does not cover the entire imaging region Im5. In this case, the reference scan setting unit 100 notifies (informs) that sufficient coil elements corresponding to the imaging region Im5 of the main scan do not exist, and the MRI apparatus 20 performs neither the reference scan nor the main scan.

Figure 10:
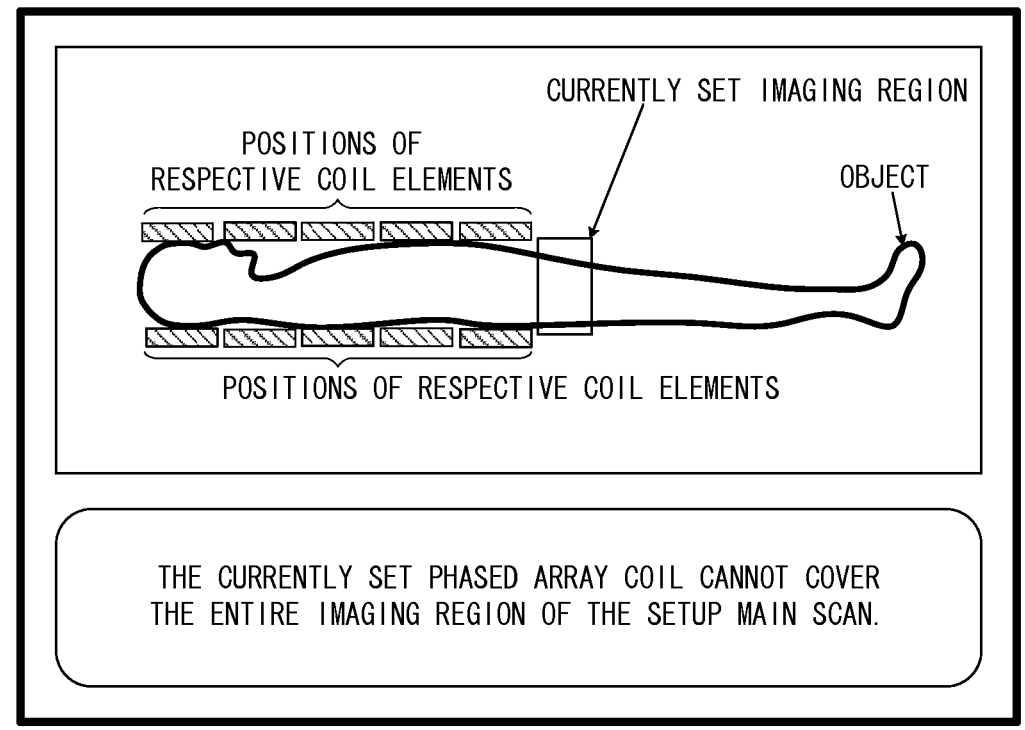
FIG. 10 is a schematic diagram showing an example of display of notification, when coil elements corresponding to the imaging region of the main scan do not exist.

FIG. 10 is a schematic diagram showing an example of display of notification, when coil elements corresponding to the imaging region of the main scan do not exist. In this case, the following textual information is displayed on the display device 64 with the range of the currently set imaging region of the main scan. That is, textual information of the phased array coil currently set on the object cannot cover the entire imaging region of the main scan currently set is displayed.

Figure 11:
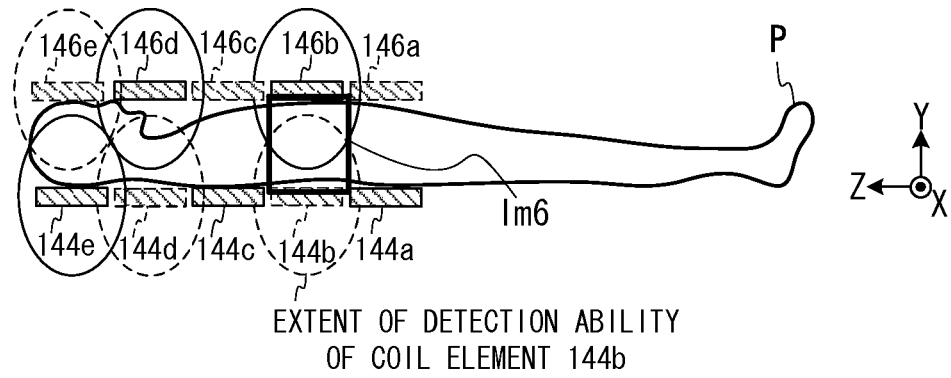
FIG. 11 is an explanatory diagram showing an example of a selection method of the coil elements used for the main scan by using a sagittal cross-section.

FIG. 11 is an explanatory diagram showing an example of selection method of the coil elements used for the main scan by using a sagittal cross-section of the patient coordinate system and the apparatus coordinate system. The above "selection" means that MR signals received by selected coil elements are used for image reconstruction. In FIG. 11, the phased array coil including the coil elements 144a to 144e and the coil elements 146a to 146e is set on the object P in the way similar to FIG. 9. Additionally, within the range over which detection sensitivity of the coil elements 144b and 146b extend, the imaging region Im6 of the main scan is set.

Here, the coil elements 144a and 146a are assumed to be the first section, the coil elements 144b and 146b are assumed to be the second section, the coil elements 144c and 146c are assumed to be the third section, the coil elements 144d and 146d are assumed to be the fourth section, and the coil elements 144e and 146e are assumed to be the fifth section.

When the imaging region Im6 is set on the above assumption, the MPU 86 selects the optimum coil elements depending on the position of the imaging region Im6 for acquisition of MR signals in the main scan. That is, the MPU 86 selects only the second section which is the minimum range of covering the imaging region Im6 for the main scan. MR signals detected by the non-selected first section, third section, fourth section and fifth section are not acquired (not inputted to the RF receiver 48).

Additionally, the reference scan setting unit 100 sets the same region as the above imaging region Im6 as the signal acquisition region of the reference scan. The difference between the present embodiment and conventional technology is that the signal acquisition region of a reference scan is optimized in the present embodiment. That is, in the present embodiment, because a reference scan is performed only on the lacking region compared with an imaging region of a main scan (or the slightly expanded region of the lacking region), a reference scan is performed again in some cases each time an imaging region of a main scan is added after table movement, for example.

On the other hand, in conventional technology, a reference scan is uniformly performed at first on the entire range over which detection sensitivity of all the coil elements 144a to 144e and 146a to 146e in FIG. 11 extends, regardless of the position of the imaging region of the main scan, and then the sensitivity distribution map is generated. In this case, though a reference scan is needed to be performed only once, the following problems may occur. That is, a reference scan may be (substantially) redundantly performed on the same region, and a reference scan may be performed on unnecessary regions.

Operation of the Present Embodiment

Figure 12:
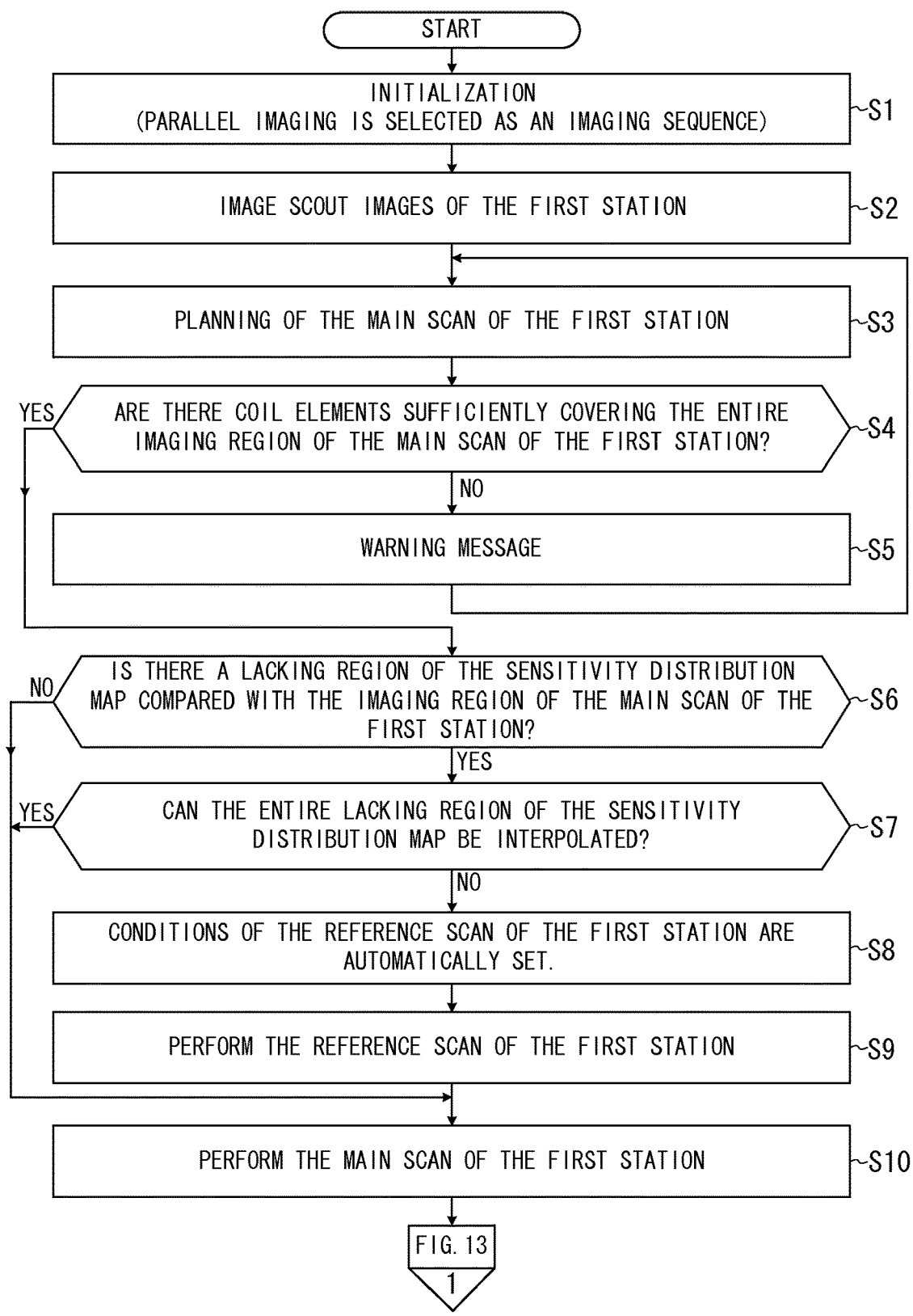
FIG. 12 is a flowchart illustrating a flow of the anterior half of a process performed by the MRI apparatus of the present embodiment.

FIG. 12 is a flowchart illustrating a flow of the anterior half of a process performed by the MRI apparatus 20 of the present embodiment, and FIG. 13 is a flowchart illustrating a flow of the posterior half of the process following FIG. 12 performed by the MRI apparatus 20. In the following, according to the step numbers in the flowcharts shown in FIG. 12 and FIG. 13, an operation of the MRI apparatus 20 will be described by referring to the aforementioned FIG. 1 to FIG. 11 as required.

[Step S1] The MPU 86 (see FIG. 2) performs initial setting of the MRI apparatus 20 based on imaging conditions inputted to the MRI apparatus 20 via the input device 62. As an example here, it is assumed that parallel imaging is inputted and set as one of the imaging conditions, and parameters such as a speed-up ratio are inputted. Additionally, the object P with the phased array coil set thereon is set on the table 34 of the bed 32 (see FIG. 3 and FIG. 4). After this, conditions such as the center frequency of RF pulses are set by a prescan and so on.

Additionally, the MRI apparatus 20 performs a coil position measuring sequence (see Japanese Publication of Patent Application No. 2010-259777, for example), and the MPU 86 calculates relative location between the object P and each coil element of the phased array coil. For example, an RF pulse is transmitted from the whole body coil WB, then MR signals are acquired by the respective coil elements, profile data for positioning coils are generated based on the acquired MR signals, and each position of the respective coil elements are calculated based on the profile data. After this, the process proceeds to Step S2.

[Step S2] The sequence controller 56 moves the table 34 to the position of the first station along the Z axis of the apparatus coordinate system, by controlling the bed controlling device 50 (see FIG. 1) according to the command of the MPU 86. The MPU 86 makes the MRI apparatus 20 image scout images of the first station by controlling each component of the MRI apparatus 20.

Specifically, a static magnetic field is formed in the imaging space by the static magnetic field magnet 22 excited by the static magnetic field power supply 40. In addition, an electric current is supplied from the shim coil power supply 42 to the shim coil 24, thereby the static magnetic field formed in the imaging space is uniformed.

Then, the MPU 86 inputs imaging conditions including a pulse sequence into the sequence controller 56. The sequence controller 56 drives the gradient magnetic field power supply 44, the RF transmitter 46 and the RF receiver 48 according to the inputted pulse sequence, thereby gradient magnetic fields are formed in the imaging region including the imaging part of the object P, and RF pulses are generated from the RF coil 28.

Then, MR signals generated by nuclear magnetic resonance inside the object P are detected by the RF coil 28 and received by the RF receiver 48. The RF receiver performs predetermined signal processing on the detected MR signals and then performs A/D conversion on the MR signals to generate raw data (digitized complex data of digitized MR signals). The RF receiver 48 inputs the generated raw data to the sequence controller 56.

The sequence controller 56 inputs the raw data to the image reconstruction unit 90. The image reconstruction unit 90 arranges the raw data in the k-space formed in the k-space database 92 as k-space data. The image reconstruction unit 90 obtains the k-space data from the k-space database 92 and reconstructs image data by performing image reconstruction processing including Fourier transformation on the obtained k-space data. The image reconstruction unit 90 stores the reconstructed image data in the image database 94.

The image processing unit 96 obtains the image data from the image database 94 and generates display image data for two-dimensional display by performing predetermined image processing on the obtained image data. The image processing unit 96 stores the display image data in the storage device 66. After this, the process proceeds to Step S3.

[Step S3] The display control unit 98 inputs the display image data of the scout images of the first station to the display device 64, and makes the display device 64 display the scout images. Then, planning of the imaging conditions of the main scan of the first station is performed. That is, some of the imaging conditions such as the imaging region are inputted and set by a user based on the displayed scout images.

The MPU 86 sets the imaging conditions of the main scan of the first station depending on the inputted imaging conditions. In this setting operation, the selection method of the coil elements used for the main scan is previously explained with FIG. 11. After this, the process proceeds to Step S4.

[Step S4] The reference scan setting unit 100 acquires the relative locations between the object P and each coil element calculated in step S1 and the positional information of the imaging region (in the apparatus coordinate system, for example) from the MPU 86. The reference scan setting unit 100 judges whether the coil elements corresponding to the entire imaging region of the main scan of the first station exist or not, based on these acquired information (see FIG. 9).

In other words, it is determined whether some or all of the coil elements of the phased array coil set on the object P can cover the entire imaging region of the main scan or not. The above "corresponding to" and "cover" mean that the entire imaging region is included within the range over which detection sensitivity (detection ability) of the coil elements extends. The meaning of the range over which detection sensitivity extends is the same as the previous explanation.

When some or all of the coil elements can cover the entire imaging region of the main scan, the reference scan setting unit 100 and the MPU 86 bring forward the process to Step S6. If this is not the case, the reference scan setting unit 100 and the MPU 86 bring forward the process to Step S5.

[Step S5] The reference scan setting unit 100 makes the display device 64 display the following message with, for example, textual information by controlling the display control unit 98 (see FIG. 10). That is, the phased array currently set on the object P cannot cover the entire imaging region of the main scan of the first station is displayed. Thereby, the reference scan setting unit 100 notifies a user of the above message (caution) meaning that the coil elements corresponding to the entire imaging region do not exist. In this case, the reference scan setting unit 100 and MPU 86 return the process to Step S3. That is, planning of the main scan of the first station is performed again.

[Step S6] The reference scan setting unit 100 stores and retains the positional information of the sensitivity distribution map and its existence region during imaging span of the same object. Thus, if the sensitivity distribution map has already been generated in a sequence before Step S1 for the same object P as the object being imaged after Step S1 of parallel imaging, this sensitivity distribution map is used in the following judgment.

The reference scan setting unit 100 judges whether the sensitivity distribution map covering the entire imaging region of the main scan of the first station exists or a lacking region exists. If the lacking region does not exist (if the sensitivity distribution map covers the entire imaging region), the reference scan setting unit 100 and the MPU 86 bring forward the process to step S10.

If the lacking region exists, the reference scan setting unit 100 calculates the lacking region by eliminating the overlap region between the entire imaging region of the main scan and the existence region of the sensitivity distribution map from the entire imaging region of the main scan. In this case, the reference scan setting unit 100 and the MPU 86 bring forward the process to Step S7.

[Step S7] The reference scan setting unit 100 judges whether the sensitivity distribution map for the entire lacking region can be generated by interpolation or not (see FIG. 8).

If the entire lacking region can be interpolated by using the sensitivity distribution map adjacent to the lacking region, the reference scan setting unit 100 and the MPU 86 bring forward the process to Step S10 after performing this interpolation (see FIG. 8: in this case, a reference scan is not performed in the first station).

If it is not possible to interpolate the entire lacking region, the reference scan setting unit 100 and the MPU 86 bring forward the process to Step S8.

[Step S8] The reference scan setting unit 100 sets the lacking region of the sensitivity distribution map calculated in Step S6 as the signal acquisition region of the reference scan (see FIG. 5 and FIG. 6). As an example here, though only the lacking region is set as the signal acquisition region, the slightly expanded region of the lacking region may be set as the signal acquisition region as described earlier.

Additionally, the reference scan setting unit 100 sets a pulse sequence of the reference scan by adjusting parameters such as MATRIX (each step number of the phase encode direction and the readout direction), FOV, the slice number, and GAP (interval between each slice).

Additionally, the reference scan setting unit 100 sets the combination method of the coil elements used for acquisition of MR signals in the reference scan, in such a manner that MR signals which are sufficient to generate the sensitivity distribution map for the lacking region can be received. That is, the reference scan setting unit 100 sets conditions of the reference scan, in such a manner that MR signals are acquired by using the same combination method of the coil elements as the combination method of the coil elements used for the main scan of the first station.

For example, consider a case where the slice number of a reference scan is initially set to a predetermined value (for example, twenty slices for the axial cross-section) and the slice thickness is fixed to a predetermined value. In this instance, the reference scan setting unit 100 keeps GAP approximately unchanged by decreasing the slice number in the case of a narrow signal acquisition region or increasing the slice number in the case of a wide signal acquisition region, for example.

Alternatively, when the slice number is fixed, the reference scan setting unit 100 widens a collectible range of MR signals per one slice by increasing the slice thickness in the case of a wide signal acquisition region, and narrows a collectible range of MR signals per one slice by decreasing the slice thickness in the case of a narrow signal acquisition region. By determining the slice number and the slice thickness in the above manner, GAP is decided depending on the range of the signal acquisition region.

Additionally, when other conditions are fixed, the wider the signal acquisition region is, the longer time is needed to perform the reference scan due to the wider acquisition range of MR signals. Then, the reference scan setting unit 100 keeps time necessary for a reference scan approximately constant by roughening MATRIX up to, for example, 64×64 in the case of a wide signal acquisition region, and by making MATRIX finer to, for example, 256×256 in the case of a narrow signal acquisition region.

The reference scan setting unit 100 inputs the respective conditions of the reference scan set in the above manner to the MPU 86. After this, the process proceeds to Step S9.

[Step S9] The MPU 86 makes the MRI apparatus 20 perform the reference scan by controlling each component of the MRI apparatus 20 under the conditions inputted in Step S8. That is, RF pulses are transmitted from the RF coil 28, MR signals generated due to nuclear magnetic resonance inside the object P of the signal acquisition region are detected by the coil elements selected for the reference scan and inputted to the RF receiver 48. These MR signals acquired in the above manner are arranged and stored in the k-space database 92 of the image reconstruction unit 90 via the sequence controller 56.

The map generation unit 102 obtains data of MR signals of the reference scan arranged in the k-space database 92, and generates the sensitivity distribution map of each coil element inside the signal acquisition region of the reference scan based on the obtained data. After this, the process proceeds to Step S10.

[Step S10] The MPU 86 makes the MM apparatus 20 perform the main scan based on the imaging conditions of the main scan of the first station set in Step S3. Specifically, the MPU 86 inputs the pulse sequence of parallel imaging in which the phase encode step number is roughened (made sparser) to the sequence controller 56. Then, a static magnetic field is generated in the imaging space and the static magnetic field is uniformed by the shim coil 24 in the way similar to imaging of the scout images.

The sequence controller 56 drives the gradient magnetic field power supply 44, the RF transmitter 46 and so on according to the pulse sequence inputted from the MPU 86, thereby gradient magnetic fields are formed in the imaging region, and RF pulses are generated from the RF coil 28. Thereby, the generated MR signals in the imaging region are detected by the RF coil 28 and received by the RF receiver 48. The RF receiver 48 inputs the raw data generated by performing predetermined signal processing on the detected MR signals to the sequence controller 56. The sequence controller 56 inputs the raw data to the image reconstruction unit 90, and the image reconstruction unit 90 arranges the raw data in the k-space of the k-space database 92 as k-space data. After this, the process proceeds to Step S11 of FIG. 13.

[Step S11] The sequence controller 56 moves the table 34 to the position of the second station along the Z axis of the apparatus coordinate system, by controlling the bed controlling device 50 (see FIG. 1) according to the command of the MPU 86. According to the moving direction and the moving distance of the table 34 in the above operation of this Step S11, the reference scan setting unit 100 corrects (modifies) the positional information of the existence region of the sensitivity distribution map generated in Step S9. When the sensitivity distribution map having been generated for the same the object P before Step S1 exists, the positional information of the existence region of this sensitivity distribution map generated before Step S1 is also corrected. This correction method is previously explained with FIG. 7. After this, the process proceeds to Step S12.

[Step S12] The MPU 86 makes the MRI apparatus 20 image the scout images of the second station by controlling each component of the MRI apparatus 20 in the way similar to Step S2. After this, the process proceeds to Step S13.

[Step S13] The scout images of the second station are displayed in the way similar to Step S3, and planning of the imaging conditions of the main scan of the second station is performed by a user. Then, the MPU 86 sets imaging conditions of the main scan of the second station, according to the inputted conditions. After this, the process proceeds to Step S14.

[Step S14] The reference scan setting unit 100 obtains the positional information of the imaging region of the main scan of the second station (for example, in the apparatus coordinate system) from the MPU 86. The reference scan setting unit 100 judges whether the coil elements corresponding to the entire imaging region of the main scan of the second station exist or not, based on the obtained imaging region and the relative location between the object P and each coil element calculated in Step S1. This judging method is the same as Step S4.

When some or all of the coil elements can cover the entire imaging region of the main scan, the reference scan setting unit 100 and the MPU 86 bring forward the process to Step S16. If this is not the case, the reference scan setting unit 100 and the MPU 86 bring forward the process to Step S15.

[Step S15] the reference scan setting unit 100 makes the display device 64 display the caution (warning) message in the way similar to Step S5. Then, the reference scan setting unit 100 and the MPU 86 return the process to Step S13.

[Step S16] The reference scan setting unit 100 judges whether the sensitivity distribution map covering the entire imaging region of the main scan of the second station exists or not (i.e. the reference scan setting unit 100 judges whether a lacking region exists or not).

If the lacking region does not exist at all, the reference scan setting unit 100 and the MPU 86 bring forward the process to step S20.

If the lacking region exists, the reference scan setting unit 100 calculates the lacking region by eliminating the overlap region between the entire imaging region of the main scan of the second station and the existence region of the sensitivity distribution map from the entire imaging region of the main scan of the second station. In this case, the reference scan setting unit 100 and the MPU 86 bring forward the process to Step S17.

[Step S17] The reference scan setting unit 100 judges whether the sensitivity distribution map for the entire lacking region can be generated by interpolation or not, in the way similar to Step S7. If the entire lacking region can be interpolated, the reference scan setting unit 100 and the MPU 86 bring forward the process to Step S20 after performing the interpolation. If this is not the case, the reference scan setting unit 100 and the MPU 86 bring forward the process to Step S18.

[Step S18] The reference scan setting unit 100 sets the lacking region of the sensitivity distribution map calculated in Step S16 as the signal acquisition region of the reference scan of the second station. As an example here, though only the lacking region is set as the signal acquisition region, the slightly expanded region of the lacking region may be set as the signal acquisition region as described earlier.

Additionally, the reference scan setting unit 100 sets conditions of the reference scan of the second station in the way similar to Step S8, and inputs the respective conditions of the reference scan to the MPU 86. After this, the process proceeds to Step S19.

[Step S19] The MPU 86 makes the MRI apparatus 20 perform the reference scan under the conditions inputted in Step S18 in the way similar to Step S19. Additionally, the map generation unit 102 generates the sensitivity distribution map for the lacking region, based on the MR signals acquired in the reference scan of this Step S19 in the previously explained manner. After this, the process proceeds to Step S20.

[Step S20] The MPU 86 makes the MRI apparatus 20 perform the main scan based on the imaging conditions of the main scan of the second station set in Step S13, in the way similar to Step S10. After this, the process proceeds to Step S21.

[Step S21] The image reconstruction unit 90 obtains the sensitivity distribution map(s) corresponding to all the imaging regions of the first and second station from the map generation unit 102. When the reference scan has been performed in at least one of Step S9 and Step S19, the sensitivity distribution map(s) obtained above include(s) the sensitivity distribution map for the lacking region generated in Step S9 or Step S19.

Additionally, the image reconstruction unit 90 obtains the k-space data from the k-space database 92. The image reconstruction unit 90 reconstructs image data of the main scans of the first and second station, by performing image reconstruction processing of parallel imaging including Fourier transformation on the obtained k-space data.

In this image reconstruction processing, the image reconstruction unit 90 generates the reverse conversion matrix for unfolding processing based on the sensitivity distribution map, performs the unfolding processing so as to compensate the aforementioned wraparound artifact, for example (see below the paragraph [0095] of Patent Document and Patent Document 3, for example). That is, the wraparound artifact is almost deleted by the unfolding processing according to the sensitivity distribution map(s).

The image reconstruction unit 90 stores the generated image data of the main scans of the first and second station in the image database 94. The image processing unit 96 takes in these image data from the image database 94, and generates display image data for two-dimensional display by performing predetermined image processing on the obtained image data. The image processing unit 96 stores the display image data of the main scans of the first and second station in the storage device 66. The display control unit 98 obtains the display image data from the storage device 66 under the command of the MPU 86, and makes the display device 64 display the images indicated by these display image data of the main scans of the first and second station.

Note that, the reference scan setting unit 100 stores and retains the sensitivity distribution map(s) and the positional information of its (their) existence region during imaging of the same object P. However, if another object is set on the table 34 of the bed 32 (i.e. if imaging preparation of another object is started), the reference scan setting unit 100 deletes the sensitivity distribution map(s) and the positional information. Additionally, the reference scan setting unit 100 deletes the sensitivity distribution map(s) and the positional information, if electric power supply of the MRI apparatus 20 is shut down.

Thus, in the case of continuing parallel imaging of the same the object P after this Step S21, the stored sensitivity distribution map(s) and its (their) positional information are used. However, in the case of imaging a different object, the reference scan setting unit 100 deletes the stored sensitivity distribution map(s) and its (their) positional information (i.e. a new reference scan targeting the "different object" is performed and the sensitivity distribution map is generated again). The foregoing is a description of an operation of the MRI apparatus 20 according to the present embodiment.

Effects of the Present Embodiment

As just described, in the present embodiment, because the reference scan setting unit 100 sets conditions of a reference scan of parallel imaging (Step S8 and Step S18), a user does not need to consider a reference scan. That is, manipulation burden is eased.

Additionally, a region for which the sensitivity distribution map exists is excluded from the signal acquisition region of the reference scan. That is, the reference scan setting unit 100 sets the signal acquisition region of the reference scan, in such manner that the signal acquisition region does not overlap the existence region of the sensitivity distribution map and only the imaging region of the main scan is covered.

Therefore, a reference scan is never performed on the same region redundantly. Thus, time is not taken for an unnecessary scan and storage areas are not unnecessarily occupied, as compared with conventional technology in which a reference scan is uniformly performed including an unnecessary region so as to obtain a wide range of a sensitivity distribution map.

Moreover, if it is possible to interpolate the lacking region by using the previously generated sensitivity distribution map, the sensitivity distribution map for the lacking region is generated by interpolation and a reference scan for the lacking region is not performed. As described above, because the requisite minimum region is set as the signal acquisition region of the reference scan in the present embodiment, imaging time can be shortened, and power consumption and SAR can be reduced. The above SAR means Specific Absorption Ratio, i.e. energy of an RF pulse absorbed by 1 kg of living tissue.

Additionally, the reference scan setting unit 100 retains and stores the positional information of the sensitivity distribution map, and corrects the positional information of the sensitivity distribution map depending on the table movement during imaging of the same object. Thus, the MRI apparatus 20 can perform "parallel imaging with table movement" without any problem.

Therefore, according to the embodiment described above, setting of imaging conditions of parallel imaging in MRI is enabled without making a user consider a signal acquisition region of a reference scan.

Supplementary Notes on Embodiment

[1] The execution timing of generation processing of the sensitivity distribution map after executing a reference scan is not limited, if it is performed before image reconstruction processing. That is, the execution timing of generation processing of the sensitivity distribution map may be before executing a main scan, and may be after executing a main scan. In the above embodiment, the sensitivity distribution maps corresponding to the range of MR signals acquired in the reference scan are respectively generated directly after executing each reference scan in Step S9 and Step S19, this is only an example. The sensitivity distribution map may be generated in Step 21 (which is after execution of the main scan) before the image reconstruction processing.

In the case of performing generation processing of the sensitivity distribution map after the main scan, it is preferable to calculate the lacking region of the sensitivity distribution map in Step S6 and Step S16 in the following manner for the aforementioned reason.

That is, when there is a region α having undergone a reference scan, the reference scan setting unit 100 calculates the lacking region of the sensitivity distribution map and the signal acquisition region of the reference scan on the assumption that the sensitivity distribution map for this region α has already been generated even if the sensitivity distribution map for this region α has not been generated yet.

[2] The following example has been explained. That is, a reference scan is performed on the entire lacking region regardless of possibility of partial interpolation of the lacking region, if it is impossible to interpolate the entire lacking region of the sensitivity distribution map (Step S7 and Step S8). However, embodiments of the present invention are not limited to such an aspect.

For example, if it is possible to interpolate a part of the lacking region of the sensitivity distribution map, the processing of Step S8 may be modified in the following manner. That is, the reference scan setting unit 100 judges whether the sensitivity distribution map for at least a part of the lacking region can be generated by interpolation or not, in Step S7 and Step S17. The map generation unit 102 generates the sensitivity distribution map for the part of the lacking region judged possible to be interpolated. Additionally, in Step S8 and Step S18, the reference scan setting unit 100 calculates and sets the region obtained by eliminating the part possible to be interpolated from the lacking region of the sensitivity distribution map as the signal acquisition region of the reference scan.

[3] The technology of the above embodiment is applicable to calibration scans of other imaging sequences in which the phase encode is not made sparser (thinned out) such as diffusion weighted imaging. That is, the technology of the above embodiment is applicable to a case of calculating a signal acquisition region of a calibration scan except the reference scan depending on an imaging region of a main scan.

For example, the technology of the above embodiment is applicable to a calibration scan of correcting the center frequency of RF pulses before a main scan. In this case, the MPU 86 calculates and sets a slice of a predetermined size in which the center of the imaging region of the main scan is included as the signal acquisition region, for example. Next, the MPU 86 acquires MR signals as magnetic resonance spectroscopy from the set(installed) signal acquisition region by controlling each component of the MRI apparatus 20, thereby the MPU 86 acquires frequency spectrum data. Next, the MPU 86 detects the magnetic resonance frequency of nuclear spin of hydrogen atoms based on the peak frequency obtained from the frequency spectrum data. The MPU 86 determines (corrects) the center frequency of RF pulses of the main scan based on the detected magnetic resonance frequency.

[4] An example has been described in which (as the MRI apparatus 20) the RF receiver 48 is disposed outside the gantry (see FIG. 1). However, the RF receiver 48 may be included in the gantry. Specifically, for example, an electronic circuit board that is equivalent to the RF receiver 48 may be disposed in the gantry. Then, the MR signals, which are analog electrical signals converted from the electromagnetic wave by the receiving RF coil 28, may be amplified by a pre-amplifier in the electronic circuit board, the amplified signals may be outputted to the outside of the gantry as digital signals and inputted to the sequence controller 56. In outputting the signal to the outside of the gantry, for example, an optical communication cable is preferably used to transmit the signal in the form of an optical digital signal. This is because the effect of external noise is reduced.

[5] Correspondences between terms used in the claims and terms used in the embodiment described above will be described. Note that the correspondences described below are just some of possible interpretations for reference and should not be construed as limiting the present invention.

The functions of the entirety of the static magnetic field magnet 22, the shim coil 24, the gradient magnetic field coil 26, the RF coils 28 and the control device 30 (see FIG. 1) that applies a static magnetic field, gradient magnetic fields and RF pulses so as to receive and acquire MR signals from the object P are an example of a main scan execution unit described in the claims.

The functions of the entirety of the static magnetic field magnet 22, the shim coil 24, the gradient magnetic field coil 26, the RF coils 28 and the control device 30 that acquire MR signals from the object P via the coil elements as a reference scan are an example of a calibration scan execution unit described in the claims as well as an example of a reference scan execution unit described in the claims. This is because a reference scan is an example of a calibration scan.

For the same reason, the reference scan setting unit 100 is an example of a calibration scan setting unit described in the claims as well as an example of a reference scan setting unit described in the claims.

The function of the MPU 86 that calculates the signal acquisition region of the aforementioned calibration scan of correcting the center frequency of RF pulses before the main scan is an example of a calibration scan setting unit described in the claims.

The functions of the entirety of the static magnetic field magnet 22, the shim coil 24, the gradient magnetic field coil 26, the RF coils 28 and the control device 30 that acquire MR signals from the signal acquisition region under the command of the MPU 86 (as the aforementioned magnetic resonance spectroscopy, for example) are an example of a calibration scan execution unit described in the claims.

The function of the MPU 86 that determines the imaging conditions of the main scan such as the center frequency of RF pulses, based on an execution result of a calibration scan and the function of the map generation unit 102 that generates the sensitivity distribution map based on MR signals acquired in a reference scan are examples of a condition determining unit described in the claims.

The map generation unit 102 that generates the sensitivity distribution map and the image reconstruction unit 90 that reconstructs the image data of the object P based on the sensitivity distribution map and MR signals acquired in the main scan are examples of an image generation unit described in the claims.

The upper body RF coil device 140 and the lower body RF coil device 160 that function as a phased array coil are an example of a multicoil described in the claims.

[6] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
   a multicoil including a plurality of coil elements; and
   processing circuitry configured to
      compare an imaging region of a main scan with a region for which one or more already generated sensitivity distribution maps generated by executing a first reference scan are available to the processing circuitry or for which the first reference scan has been executed,
      determine, based at least on the compare, whether a lacking region within the imaging region exists, wherein the lacking region is a region for which said already generated one or more sensitivity distribution maps are not available or for which the first reference scan has not been executed,
      when the lacking region exists, calculate the lacking region by eliminating a region of the already generated sensitivity distribution maps from the imaging region, execute a second reference scan acquiring nuclear magnetic resonance signal from the lacking region, and newly generate a sensitivity distribution map corresponding to the lacking region based on the nuclear magnetic resonance signals acquired by the second reference scan,
      when the lacking region does not exist, skip the second reference scan, and
      execute the main scan acquiring nuclear magnetic resonance signals from the imaging region via the multicoil using a parallel imaging sequence, and generate image data of an object based on the nuclear magnetic resonance signals acquired by the main scan, using the already generated and the newly generated sensitivity distribution maps when the lacking region exists, while using only the already generated sensitivity distribution maps when the lacking region does not exist.

2. The magnetic resonance imaging apparatus according to claim 1, wherein the processing circuitry is further configured to calculate the lacking region as a signal acquisition region to be scanned by a reference scan, by comparing the imaging region of the main scan with the region for which the one or more already generated sensitivity distribution maps are available.

3. The magnetic resonance imaging apparatus according to claim 2, wherein the processing circuitry is configured to perform said newly generate the sensitivity distribution map for at least a part of the lacking region by interpolation using a sensitivity distribution map for a region adjacent to the lacking region.

4. The magnetic resonance imaging apparatus according to claim 3, wherein the processing circuitry is further configured to output information indicating that coil elements corresponding to the imaging region of the main scan do not exist, if it is determined by the processing circuitry that coil elements corresponding to the imaging region of the main scan do not exist.

5. The magnetic resonance imaging apparatus according to claim 4, further comprising
   a table on which the object is placed;
   wherein the processing circuitry is further configured to correct positional information of an existence region of the already generated sensitivity distribution maps according to movement of the table, and store corrected positional information of the existence region of the sensitivity distribution maps until imaging preparation of another object is started.

6. The magnetic resonance imaging apparatus according to claim 4, further comprising
   a table on which the object is placed;
   wherein the processing circuitry is further configured to correct positional information of an existence region of the already generated sensitivity distribution maps according to movement of the table, and store corrected positional information of the existence region of the sensitivity distribution maps until power of the magnetic resonance imaging apparatus is shut down.

7. The magnetic resonance imaging apparatus according to claim 1, wherein the processing circuitry is further configured to calculate the lacking region as a signal acquisition region to be scanned by the second reference scan by comparing the imaging region of the main scan with a region for which the first reference scan has been executed.

8. The magnetic resonance imaging apparatus according to claim 7, wherein the processing circuitry is configured to generate the sensitivity distribution map for at least a part of the lacking region by interpolation using a sensitivity distribution map for a region adjacent to the lacking region.

9. The magnetic resonance imaging apparatus according to claim 8, wherein the processing circuitry is further configured to output information indicating that coil elements corresponding to the imaging region of the main scan do not exist, if it is determined by the processing circuitry that coil elements corresponding to the imaging region of the main scan do not exist.

10. The magnetic resonance imaging apparatus according to claim 9, further comprising
    a table on which the object is placed;
    wherein the processing circuitry is further configured to correct positional information of an existence region of the already generated sensitivity distribution maps according to movement of the table, and store corrected positional information of the existence region of the already generated sensitivity distribution maps until imaging preparation of another object is started.

11. The magnetic resonance imaging apparatus according to claim 9, further comprising
    a table on which the object is placed;
    wherein the processing circuitry is further configured to correct positional information of an existence region of the already generated sensitivity distribution maps according to movement of the table, and store corrected positional information of the existence region of the already generated sensitivity distribution maps until power of the magnetic resonance imaging apparatus is shut down.

12. The magnetic resonance imaging apparatus according to claim 1, further comprising
a table on which the object is placed;
wherein the processing circuitry is further configured to correct positional information of an existence region of the already generated sensitivity distribution maps according to movement of the table, and store corrected positional information of the existence region of the already generated sensitivity distribution maps until imaging preparation of another object is started.

13. The magnetic resonance imaging apparatus according to claim 1, further comprising
a table on which the object is placed;
wherein the processing circuitry is further configured to correct positional information of an existence region of the sensitivity distribution map according to movement of the table, and store corrected positional information of the existence region of the already generated sensitivity distribution map until power of the magnetic resonance imaging apparatus is shut down.

14. The magnetic resonance imaging apparatus according to claim 1, wherein the processing circuitry is further configured to calculate the lacking region by comparing the imaging region of the main scan with a region for which the sensitivity distribution map exists, and to calculate an expanded region of the lacking region as a signal acquisition region to be scanned by the second reference scan.

15. The magnetic resonance imaging apparatus according to claim 14, wherein the processing circuitry is further configured to output information indicating that coil elements corresponding to the imaging region of the main scan do not exist, if it is determined that coil elements corresponding to the imaging region of the main scan do not exist.

16. The magnetic resonance imaging apparatus according to claim 1, wherein the processing circuitry is further configured to calculate the lacking region by comparing the imaging region of the main scan with a region on which the first reference scan has been executed, and to calculate an expanded region of the lacking region as a signal acquisition region to be scanned by the second reference scan.

17. The magnetic resonance imaging apparatus according to claim 16, wherein the processing circuitry is further configured to output information indicating that coil elements corresponding to the imaging region of the main scan do not exist, if it is determined that coil elements corresponding to the imaging region of the main scan do not exist.

18. A magnetic resonance imaging method comprising:
comparing an imaging region of a main scan with a region for which one or more already generated sensitivity distribution maps generated by executing a first reference scan are available or for which the first reference scan has been executed,
determining, based at least on the comparing, whether a lacking region within the imaging region exists, wherein the lacking region is a region for which said already generated one or more sensitivity distribution maps are not available or for which the first reference scan has not been executed,
when the lacking region exists, calculating the lacking region by eliminating a region of the already generated sensitivity distribution maps from the imaging region, executing a second reference scan acquiring nuclear magnetic resonance signal from the lacking region; and newly generating a sensitivity distribution map corresponding to the calculated lacking region based on the nuclear magnetic resonance signals acquired by the second reference scan;
when the lacking region does not exist, skip the second reference scan, executing the main scan acquiring the nuclear magnetic resonance signals from the imaging region of the main scan via a multicoil using a parallel imaging sequence; and generating image data of an object based on the nuclear magnetic resonance signals acquired by the main scan, using the already generated and newly generated sensitivity distribution maps when the lacking region exists, while using only the already generated sensitivity distribution maps when the lacking region does not exist.

* * * * *